United States Patent
Diamantidis

(10) Patent No.: US 8,456,077 B2
(45) Date of Patent: Jun. 4, 2013

(54) LAMP DEVICE COMPRISING ILLUMINATES SURROUNDED BY SOLID PARTICLES COMPRISING A PARTICLE NUMBER DENSITY GRADIENT IN A DIRECTION AWAY FROM THE ILLUMINATES

(75) Inventor: Georg Diamantidis, Dernbach (DE)

(73) Assignee: LOK-F GmbH (DE)

( * ) Notice: Subject to any disclaimer, the term of this patent is extended or adjusted under 35 U.S.C. 154(b) by 8 days.

(21) Appl. No.: 12/991,086

(22) PCT Filed: Apr. 30, 2009

(86) PCT No.: PCT/EP2009/003127
§ 371 (c)(1),
(2), (4) Date: Nov. 4, 2010

(87) PCT Pub. No.: WO2009/135620
PCT Pub. Date: Nov. 12, 2009

(65) Prior Publication Data
US 2011/0058379 A1    Mar. 10, 2011

(30) Foreign Application Priority Data

May 8, 2008  (DE) .......................... 10 2008 022 888
Jun. 18, 2008  (DE) .......................... 10 2008 028 969
Jan. 21, 2009  (DE) .......................... 10 2009 005 380

(51) Int. Cl.
*H01J 29/86* (2006.01)
*F21V 7/00* (2006.01)

(52) U.S. Cl.
USPC ................... 313/503; 313/502; 362/296.01

(58) Field of Classification Search
None
See application file for complete search history.

(56) References Cited

U.S. PATENT DOCUMENTS

| 6,746,885 | B2 * | 6/2004 | Cao ................................. 438/26 |
| 7,309,881 | B2 | 12/2007 | Sato et al. |
| 7,371,593 | B2 | 5/2008 | Harada |
| 2005/0035365 | A1 | 2/2005 | Sato et al. |
| 2005/0052885 | A1 | 3/2005 | Wu |
| 2005/0224818 | A1 | 10/2005 | Harada |
| 2006/0073625 | A1 | 4/2006 | Harada |
| 2006/0214562 | A1 | 9/2006 | Chang et al. |
| 2007/0096113 | A1 | 5/2007 | Inoshita et al. |
| 2007/0228390 | A1 | 10/2007 | Hattori et al. |
| 2007/0284563 | A1 | 12/2007 | Lee et al. |
| 2008/0029778 | A1 | 2/2008 | Kim et al. |
| 2008/0074032 | A1 | 3/2008 | Yano et al. |
| 2008/0213928 | A1 | 9/2008 | Harada |
| 2008/0265268 | A1 | 10/2008 | Braune et al. |
| 2009/0039762 | A1 | 2/2009 | Park et al. |

FOREIGN PATENT DOCUMENTS

| DE | 10 2004 004 947 A1 | 8/2005 |
| DE | 10 2005 046 420 A1 | 4/2006 |
| DE | 10 2006 020 529 A1 | 3/2007 |
| EP | 1 507 296 A1 | 2/2005 |
| EP | 1 843 400 A1 | 10/2007 |
| WO | 2005067068 A1 | 7/2005 |
| WO | 2005112137 A1 | 11/2005 |
| WO | 2008043519 A1 | 4/2008 |

* cited by examiner

*Primary Examiner* — Britt D Hanley
(74) *Attorney, Agent, or Firm* — Factor Intellectual Property Law Group, Ltd.

(57) ABSTRACT

A lamp device comprising illuminant, which emits a primary radiation on applying a voltage thereto and solid particles, at least partly enclosing the illuminant and which interact with the primary radiation. The particle number density changes in at least one direction away from the illuminant from a first particle number density to a second particle number density.

23 Claims, 19 Drawing Sheets

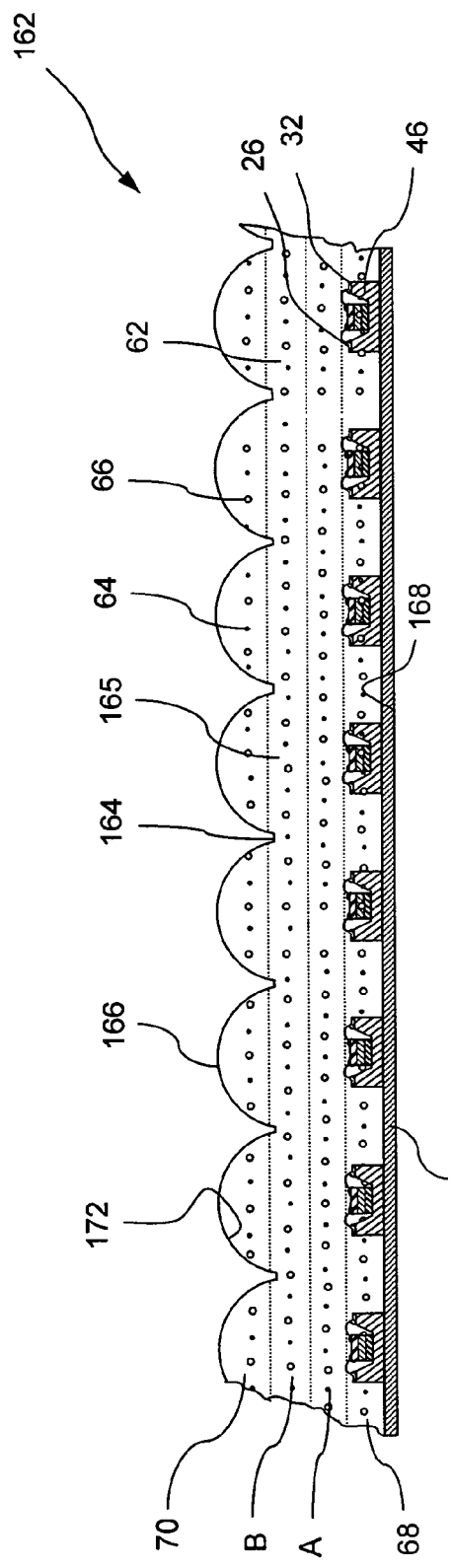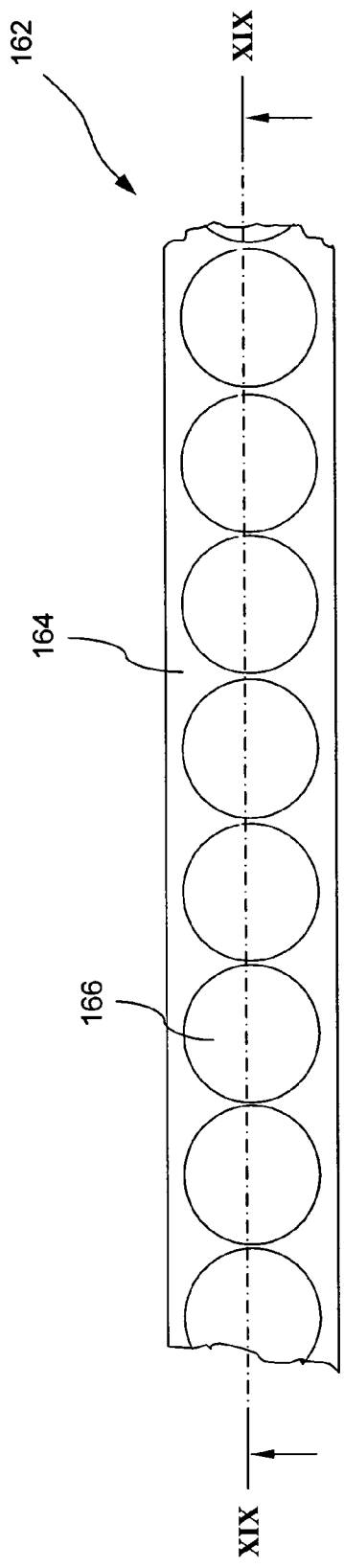
Fig. 19
Fig. 20

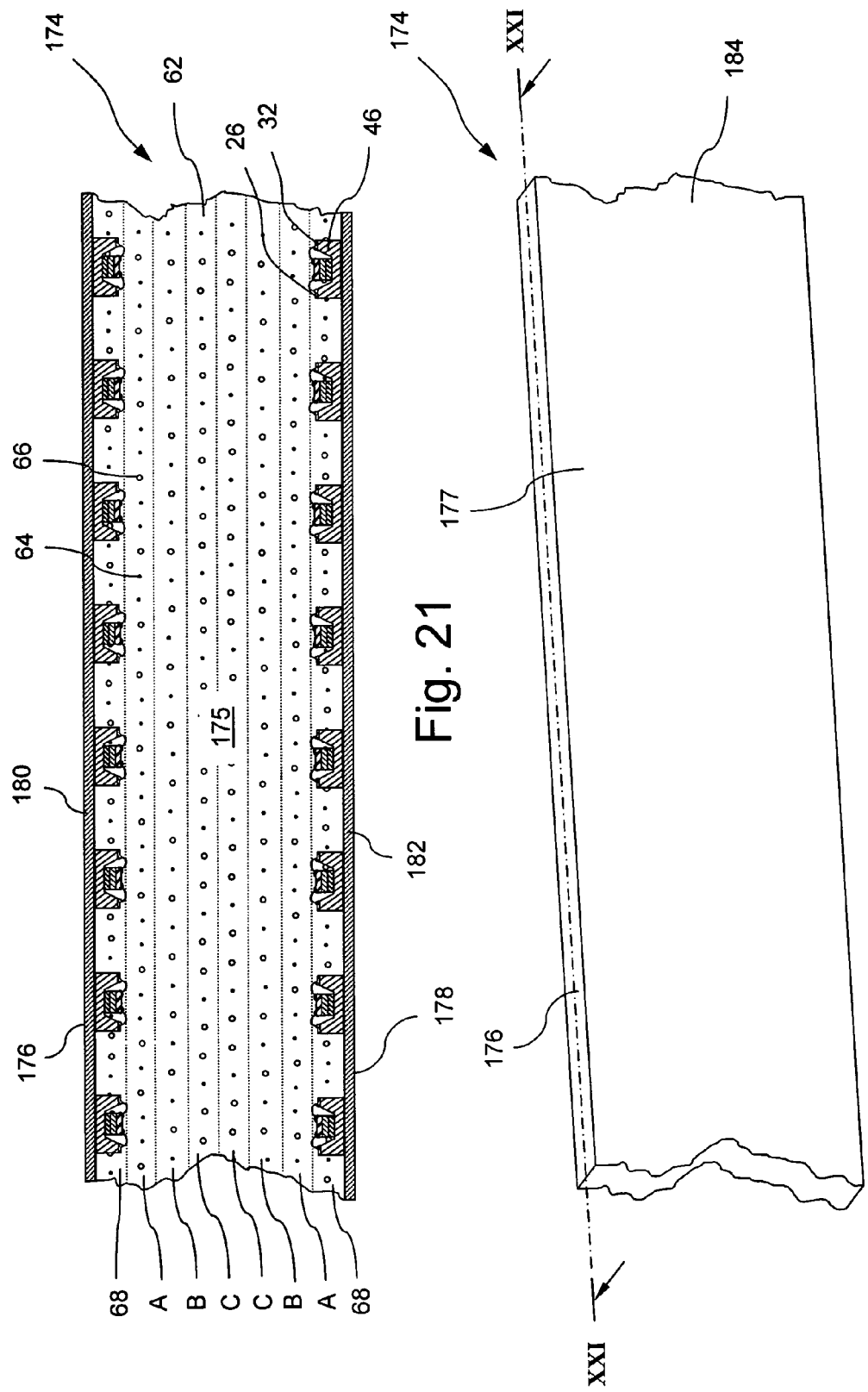

LAMP DEVICE COMPRISING ILLUMINATES SURROUNDED BY SOLID PARTICLES COMPRISING A PARTICLE NUMBER DENSITY GRADIENT IN A DIRECTION AWAY FROM THE ILLUMINATES

RELATED APPLICATIONS

This application claims the filing benefit of International Patent Application No. PCT/EP2009/003127, filed Apr. 30, 2009, which claims the filing benefit of German Patent Application No. 10 2008 022 888.5 filed May 8, 2008, German Patent Application No. 10 2008 028 969.8 filed Jun. 18, 2008, and German Patent Application No. 10 2009 005 380.8 filed Jan. 21, 2009, the contents of all of which are incorporated herein by reference.

TECHNICAL FIELD

The invention concerns a lamp device with
a) illuminants, which emit a primary radiation when voltage is applied to them;
b) solid particles, which at least partly enclose the illuminants and which interact with the primary radiation.

BACKGROUND OF THE INVENTION

Such lamp devices are known from the market, LEDs with a light-emitting semiconductor structure being increasingly used as illuminants. As solid particles which interact with the primary radiation, in particular luminous material particles are used, which are known per se, are produced from transparent materials having colour centres, and absorb radiation which strikes them, and they emit radiation as secondary radiation at least in one different wavelength. Thus with a suitable choice of luminous material particles or luminous material particle mixtures, the radiation emitted by the illuminants can be converted into radiation with a different spectrum. Here a different kind of solid particles which interact with the primary radiation can be, for example, reflection particles which can reflect and scatter radiation which strikes them.

Known lamp devices of the above-mentioned kind often have a relatively small angle of radiation, between 120° and 160°, for the light which they emit.

The present invention is directed to resolving these and other matters.

SUMMARY OF THE INVENTION

An object of the invention is to create a lamp device of the above-mentioned kind in which the lighting effect is improved and in particular the angle of radiation is increased.

This object may be achieved in the case of a lamp device of the above-mentioned kind in that
c) the particle number density of the particles changes in at least one direction away from the illuminants from a first particle number density to a second particle number density.

It has been shown that with such a distribution of particles interacting with the primary radiation around the illuminant, a kind of lamp structure which itself emits light in substantially all spatial directions can be achieved. In this way the angle of radiation of the lamp device can be increased. The luminosity of the lamp device is also amplified.

The particle number density indicates the number of particles per unit volume.

Advantageous further developments are given in the dependent claims.

It is advantageous if the particles include luminous material particles which absorb primary radiation and emit secondary radiation, and/or reflection particles, in particular barium sulfide, barium sulfite, barium sulfate or titanium dioxide particles.

A specially intensive lighting effect is achieved if the change of particle number density is a reduction, in particular if the particle number density is reduced evenly.

The lighting effect is even better if a) a greatest particle number density is present in a first region, which is arranged closest to the illuminants compared with other regions, and b) a smallest particle number density is present in a second region, which is furthest from the illuminants compared with other regions. In this case, therefore, the particle number density decreases with increasing distance from the illuminants.

Good lighting results are achieved if the greatest particle number density is 5 to 10,000 times, preferably 10 to 100 times, again preferably 10 to 20 times the smallest particle number density.

It is advantageous if a) the greatest particle number density is between 500 and 20,000 particles per cubic centimeter, preferably between 1,000 and 10,000 particles per cubic centimeter, and again preferably between 5,000 and 10,000 particles per cubic centimeter, and b) the smallest particle number density is between 2 and 5,000 particles per cubic centimeter, preferably between 2 and 2,500 particles per cubic centimeter, and again preferably between 2 and 1,000 particles per cubic centimeter.

From a production engineering point of view, it is advantageous if the particles are held in their position relative to the illuminants by a carrier medium.

It has been shown to be particularly advantageous if the carrier medium is a silicone material, in particular an elastic silicone mass, or a resin, in particular an epoxy resin or polyester resin.

Depending on the form of the volume which the carrier medium occupies, various lighting effects can be achieved. It has been shown to be visually appealing with a good lighting effect if the carrier medium with the particles occupies a cylindrical, conical or hemispherical volume, or a volume which includes a section which is in the form of a truncated cone and blends into a spherical section. It has been shown to be specially advantageous if the carrier medium with the particles occupies a U-shaped volume.

For producing the illuminant, it is advantageous if the carrier medium with the particles is arranged in a chamber of the lamp device.

It is advantageous if the chamber wall, at least in regions, is of glass or synthetic material, in particular an epoxy resin or polyester resin.

An advantageous lighting effect can be achieved if multiple air bubbles are provided in the carrier medium.

It has been shown to be advantageous if the concentration of air bubbles in the carrier medium has a value of 500 to 20,000 air bubbles per $cm^3$, preferably a value of 1,000 to 10,000 air bubbles per $cm^3$, and again preferably a value of 3,000 to 5,000 air bubbles per $cm^3$.

Preferably, the air bubbles have a diameter of 0.1 mm to 2 mm, preferably 0.1 mm to 1 mm, and again preferably 0.2 mm to 0.5 mm.

A specially good lighting effect can be achieved if multiple volumes which are determined by the carrier medium with the particles, and which are arranged at a distance from each other, are present.

It has been shown to be particularly practicable if two or three volumes which are determined by the carrier medium with the particles, and which are arranged at a distance from each other, are present.

A lamp with good lighting properties can be formed if the volumes are provided in multiple receiving regions of a light source.

It is also advantageous for aesthetic reasons if the light source is cylindrical and the receiving regions are in the form of channels parallel to its axis.

If the illuminants include at least one semiconductor structure which emits light when voltage is applied to it, the lamp device can be produced with low energy consumption. Such illuminants are known in the form of light-emitting diodes (LEDs).

If the at least one light-emitting semiconductor structure emits blue light when voltage is applied to it, it is possible to go back to LEDs which are known per se. The particles are preferably in the form of both luminous material particles, which generate white light from the blue radiation emitted by the semiconductor structure, and reflection particles, which pass on the radiation which strikes them.

Alternatively, the illuminants can include at least one red light semiconductor structure, at least one green light semiconductor structure and at least one blue light semiconductor structure. In this case, luminous material particles can be forgone, and only reflection particles can be used as particles which interact with the primary radiation.

To increase the light spectrum, the illuminants can include at least one infrared semiconductor structure and/or at least one ultraviolet semiconductor structure.

To achieve a good lighting effect, it is advantageous if there are at least three layers in which the solid particles, in particular luminous material particles and/or reflection particles, are present with different particle number densities.

It is to be understood that the aspects and objects of the present invention described above may be combinable and that other advantages and aspects of the present invention will become apparent upon reading the following description of the drawings and detailed description of the invention.

BRIEF DESCRIPTION OF THE DRAWINGS

FIG. 19 shows a cross-section through a light band, along the cross-section line XIX-XIX in FIG. 20;

FIG. 20 shows a plan view of the light band of FIG. 19;

FIG. 21 shows a cross-section through a light panel, along the cross-section line XXI-XXI in FIG. 22;

FIG. 22 shows a perspective view of the light panel according to FIG. 20.

DETAILED DESCRIPTION OF THE PRESENT INVENTION

Figure 1:
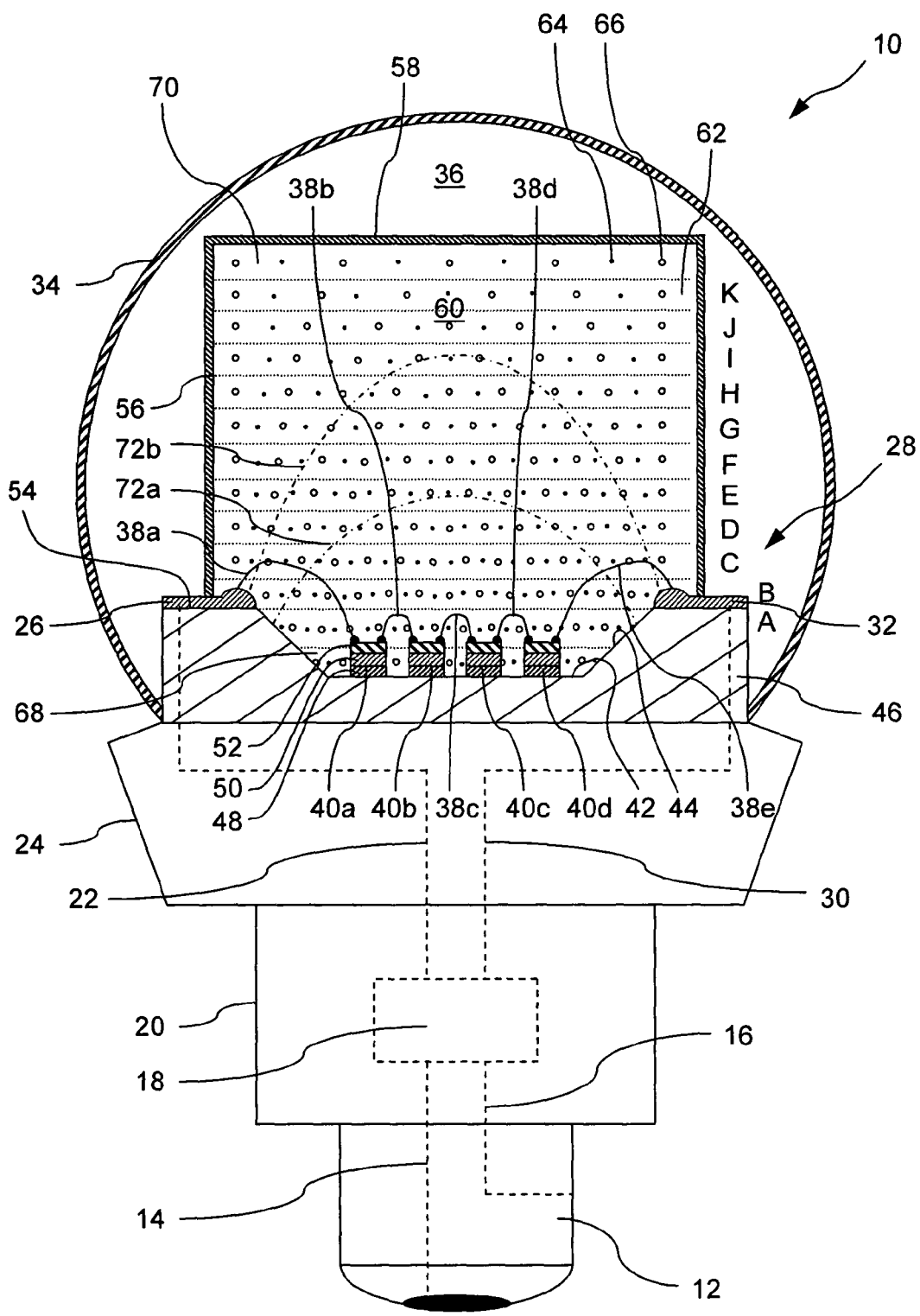
FIG. 1 shows a partial section of a bulb lamp, wherein a carrier medium loaded with luminous material particles and reflection particles is arranged in a cylindrical chamber.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

In FIG. 1, a bulb lamp as a whole, including a standardised connection base 12, is designated by 10. The connection base 12 can, for example, be in the form of an Edison screw base E27 or E11. All other standardised connection bases, e.g. a bayonet base, a plug-in base, a glass pinch base or similar, can be provided.

From the connection areas of the connection base 12, two wires 14, 16, shown by dashed lines, run within it. These lead from the connection base 12 to a voltage transformer 18, which is arranged inside a transformer housing 20, which is carried by the connection base 12. From the voltage transformer 18, a first power supply line 22 leads through a heat sink 24 to a first contact area 26 of a light chip arrangement 28. A second power supply line 30 leads from the voltage transformer 18 through the heat sink 24 to a second contact area 32 of the light chip arrangement 28.

The bulb lamp 10 includes a bulb 34 of a translucent material, e.g. glass or epoxy resin, which with the heat sink 24 delimits an interior 36 of the bulb lamp 10. The bulb 34 of the bulb lamp 10 can fulfill the function of a converging lens if required.

The light chip arrangement 28 includes four semiconductor structures 40a, 40b, 40c and 40d (shown only schematically in FIG. 1), which are connected in series between the contact areas 26 and 32 of the light chip arrangement 28 by means of thin bonding wires 38a, 38b, 38c, 38d and 38e. These are arranged on the floor 42 of an indentation 44 of a carrier substrate 46. The carrier substrate 46 is of sapphire glass, also known as corundum glass ($Al_2O_3$ glass).

Each semiconductor structure 40 includes three layers, which are provided with reference symbols only in the case of the semiconductor structure 40a. A bottom layer 48, which is adjacent to the carrier substrate 46, is an n-conducting layer, e.g. of n-GaN or n-InGaN. A middle layer 50 is an MQW layer. MQW is the abbreviation for "multiple quantum well". An MQW material represents a superlattice, which has an electronic band structure which is changed according to the superlattice structure and accordingly emits light at different wavelengths. The spectrum of the radiation emitted by the semiconductor structure 40 can be influenced by the choice of the MQW layer. A top layer 52 is produced from a p-conducting III-V semiconductor material, e.g. p-GaN.

With its edge region 54, which radially surrounds the indentation 44, the carrier substrate 46 supports a cylindrical housing 56, which is open towards the semiconductor structures 40 and on the side away from the carrier substrate 46 is closed by an end wall. The housing 56 is made of synthetic material and is transparent, either clear or matt. The housing 56, together with the carrier substrate 46, delimits a chamber 60, which apart from the indentation 44 in the carrier substrate 46 is also cylindrical.

The chamber 60 is filled with a carrier medium 62, which in the case of the embodiment described here is present in the form of an elastic silicone mass. In the silicone mass 62, luminous material particles 64 and reflection particles 66 are distributed, and are held by the silicone mass 62 in their position relative to the semiconductor structures 40.

When a voltage is applied, the semiconductor structures 40 radiate ultraviolet light and blue light in a wavelength range from 420 nm to 480 nm. Because of the silicone mass 62, which envelops the semiconductor structures 40, with the luminous material particles 64, a white light bulb lamp 10 can be obtained. The luminous material particles 64 are produced from solid materials which have colour centres. To convert the ultraviolet and blue primary radiation of the semiconductor structures 40 into white light, three kinds of luminous material particles 64, which partly absorb the ultraviolet and blue light and themselves emit in the yellow and red, are used. If desired, additional luminous material particles 64 which themselves emit in the blue can be used.

As material for the reflection particles 66, in particular barium sulfide, barium sulfite, barium sulfate or titanium dioxide come into question. Alternatively, as material for the reflection particles 66, scandium oxide or zinc sulfide, and oxides of lanthanum and the rare earth metals, e.g. cerium oxide, neodymium oxide, samarium oxide, europium oxide, gadolinium oxide, dysprosium oxide, holmium oxide, erbium oxide, thulium oxide, ytterbium oxide or lutetium oxide, can be used.

Because of the reflection particles 66, the radiation which the semiconductor structures 40 emit is passed on within the silicone mass 62.

The particle number density of the luminous material particles 64 and reflection particles 66 changes in the direction of the end wall 58 of the housing 56, i.e. in a direction away from the semiconductor structures 40, and decreases in this direction. The greatest particle number density of the luminous material particles 64 and reflection particles 66 is present in a first layer 68 of the silicone mass 62, which is arranged nearest the semiconductor structures 40 within the chamber 60. The smallest particle number density of the luminous material particles 64 and reflection particles 66 is present in a second layer 70 of the silicone mass 62, which is arranged furthest from the semiconductor structures 40 and adjacent to the inner surface of the end wall 58 of the housing 56.

Between the first layer 68 and the second layer 70, intermediate layers designated by upper case letters A to K are arranged, the particle number density of the luminous material particles 64 and reflection particles 66 decreasing evenly from one layer to the next in the direction of the end wall 58 of the housing 56. This is illustrated by the number of luminous material particles 64 and reflection particles 66 shown in each layer. The boundary between two successive layers 68, A to K and 70 is indicated in each case by a dotted line.

Depending on the power with which the semiconductor structures 40 are operated, and which can be provided via the voltage transformer 18, by the distribution of the luminous material particles 64 and reflection particles 66 within the silicone mass 62 various lamp structures with different outer contours can be generated. They can give an observer the impression of a flame or light sphere, for example, and are formed starting from the semiconductor structures 40.

In FIG. 1, the outer contours of a round light structure 72a and a flame-like light structure 72b are indicated in stylised form as dash-dotted lines. A round light structure 72a is formed at a lower operating voltage of the bulb lamp 10, whereas the flame-like light structure 72b occurs at a higher operating voltage of the bulb lamp 10. At a suitably high operating voltage, substantially the whole silicone mass 62 in the chamber 60 lights; the form of the lamp structure is then cylindrical.

In production of the bulb lamp 10, the chamber 60 can be filled in layers with relatively low-viscosity silicone oil, which has previously been mixed with a curing agent and the necessary quantity of luminous material particles 64 and reflection particles 66 for the desired particle number density. The silicone oil then cures into an elastic silicone mass 62, in a way which is known per se. After a first layer is cured, a further layer of silicone material 62 with luminous material particles 64 and reflection particles 66 can be produced correspondingly on the first layer.

So that the chamber 60 can be filled in this way, for example a filler neck, which is removed or sealed when the chamber 60 has been completely filled, can be provided.

It has been shown to be practicable if the particle number density of the luminous material particles 64 and reflection particles 66 is chosen so that the cured silicone mass 62 appears to the human eye to be slightly milky to yellow transparent. This is achieved, among other ways, if the greatest particle number density of the luminous material particles 64 and reflection particles 66 is 5 to 10,000 times, preferably 10 to 100 times, again preferably 10 to 20 times the smallest particle number density of the luminous material particles 64 and reflection particles 66.

In practice, the greatest particle number density of the luminous material particles 64 and reflection particles 66 can be between 500 and 20,000 particles per cubic centimeter, preferably between 1,000 and 10,000 particles per cubic centimeter, and again preferably between 5,000 and 10,000 particles per cubic centimeter, whereas the smallest particle number density of the luminous material particles 64 and reflection particles 66 can have values between 2 and 5,000 particles per cubic centimeter, preferably between 2 and 2,500 particles per cubic centimeter, and again preferably between 2 and 1,000 particles per cubic centimeter.

In a modification, not only blue light semiconductor structures 40 are used, but white light is gained by a combination of at least one red light semiconductor structure 40a, one green light semiconductor structure 40b and one blue light semiconductor structure 40c, no fourth semiconductor structure 40d being used. In this case, the luminous material particles 64 in the silicone mass 62 can be omitted, and only reflection particles 66 can be distributed in the silicone mass 62 with the appropriate particle number densities.

In a further modification, the carrier medium 62 can be of a resin, e.g. an epoxy resin or polyester resin, which is translucent in the cured state. In this case, the layers 68, A to K and 70 of the carrier medium 62 can be gained by curing layers of a resin which is applied in liquid form, and to which a curing agent is added, as is known per se, and which was previously mixed with the necessary quantity of luminous material particles 64 and reflection particles 66 for the desired particle number density.

In a further modification, the carrier medium 62 can occupy the volume corresponding to the chamber 60 without the latter being delimited from the housing 56. For this purpose, the housing 56 is removed after the carrier medium has been completely cured, and is thus used as a casting mould for the carrier medium 62.

Figure 2:
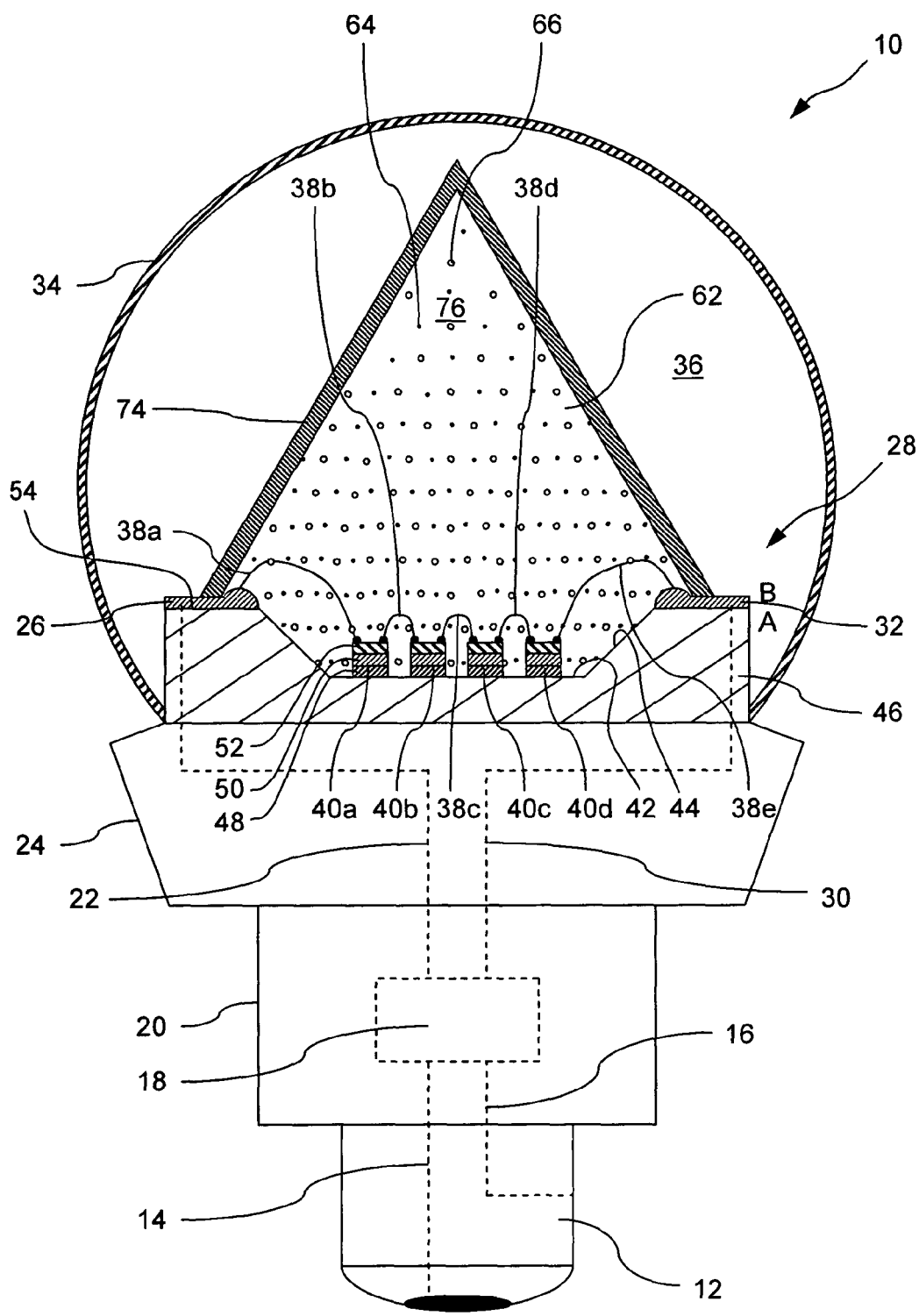
FIG. 2 shows a partial section, corresponding to FIG. 1, of a second embodiment of a bulb lamp, wherein the chamber is conical.
Figure 3:
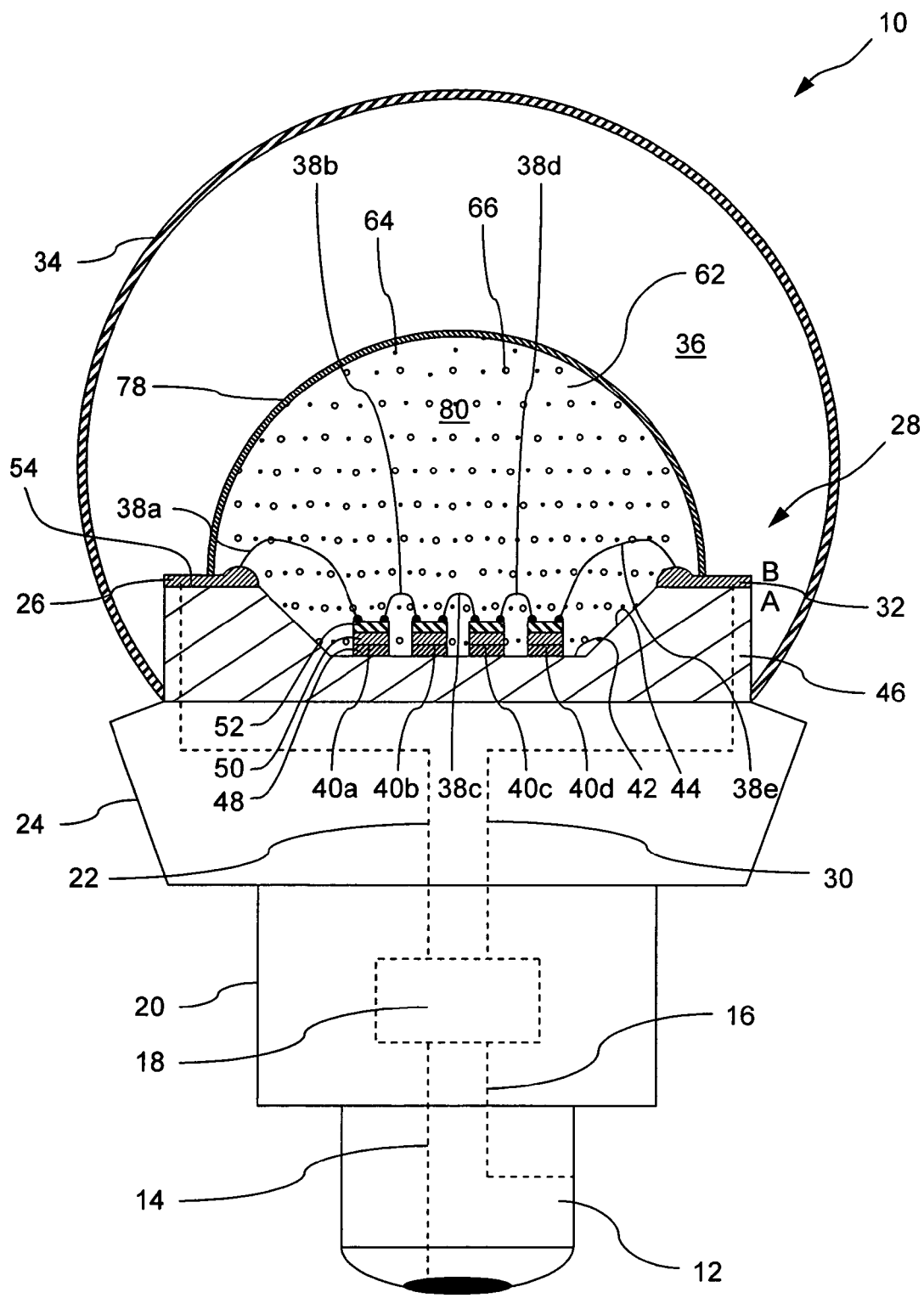
FIG. 3 shows a partial section, corresponding to FIG. 1, of a third embodiment of a bulb lamp, wherein the chamber is hemispherical.
Figure 4:
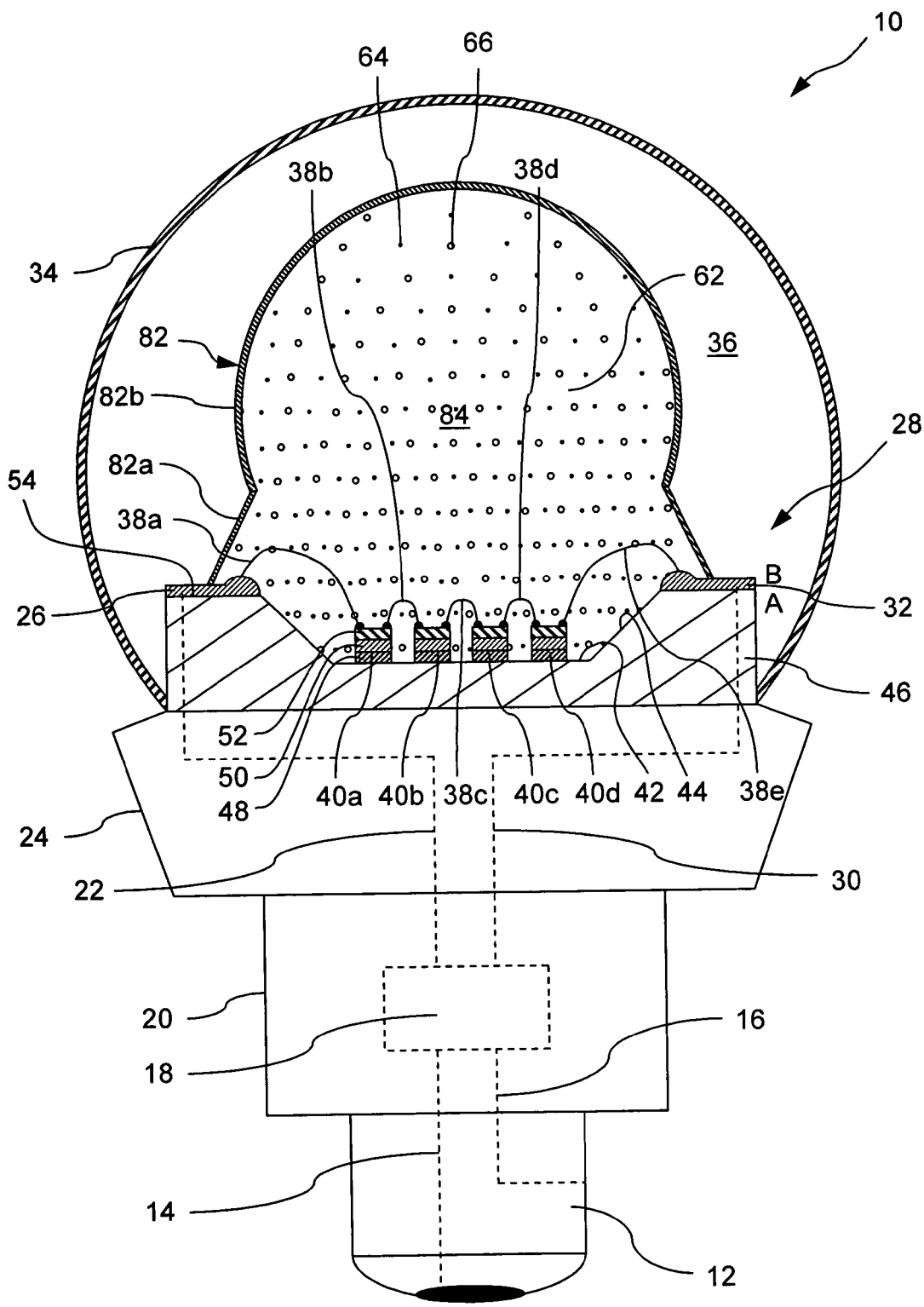
FIG. 4 shows a partial section, corresponding to FIG. 1, of a fourth embodiment of a bulb lamp, wherein the chamber has a section which is in the form of a truncated cone and blends into a spherical section.

In FIGS. 2, 3 and 4, further embodiments of the bulb lamp 10, which differ from the bulb lamp 10 shown in FIG. 1 only in the shape of the housing 56 which jointly delimits the chamber 60, are shown. For clarity, the individual layers of the carrier medium 62 are not individually provided with reference symbols in FIGS. 2, 3 and 4, and the dotted lines which indicate the layer boundaries are also omitted. Unless otherwise explained below, what is said about the bulb lamp 10 according to FIG. 1 applies mutatis mutandis to the bulb lamps 10 according to FIGS. 2 to 4.

In the case of the bulb lamp 10 in FIG. 2, instead of the housing 56 a conical housing 74 is provided, so that the carrier medium 62 occupies a conical volume within a chamber 76 which is conical apart from the indentation 44 in the carrier substrate 46. The conical housing 74 is arranged so that its apex is at a distance from the semiconductor structures 40. Thus with a suitable operating voltage, the lamp structure which is formed here can have the form of a cone.

In the case of the bulb lamp 10 in FIG. 3, instead of the housing 56 a hemispherical housing 78 is provided, so that the carrier medium 62 occupies a hemispherical volume within a chamber 80 which is hemispherical apart from the indentation 44 in the carrier substrate 46. The hemispherical housing 78 is arranged so that its curvature is at a distance from the semiconductor structures 40. Thus with a suitable operating voltage, the lamp structure which is formed here can have the form of a hemisphere.

In the case of the bulb lamp 10 in FIG. 4, instead of the housing 56 a housing 82, which includes a section 82a which is in the form of a truncated cone and blends into a spherical section 82b, is provided. The housing 82 with its section 82a in the form of a truncated cone sits on the edge region 54 of the carrier substrate 46. The carrier medium 62 thus occupies a corresponding volume within a chamber 84, which apart from the indentation 44 in the carrier substrate 46 has a region in the form of a truncated cone and a hemispherical region. Thus with a suitable operating voltage, the lamp structure which is formed here can have a corresponding form.

Figure 5:
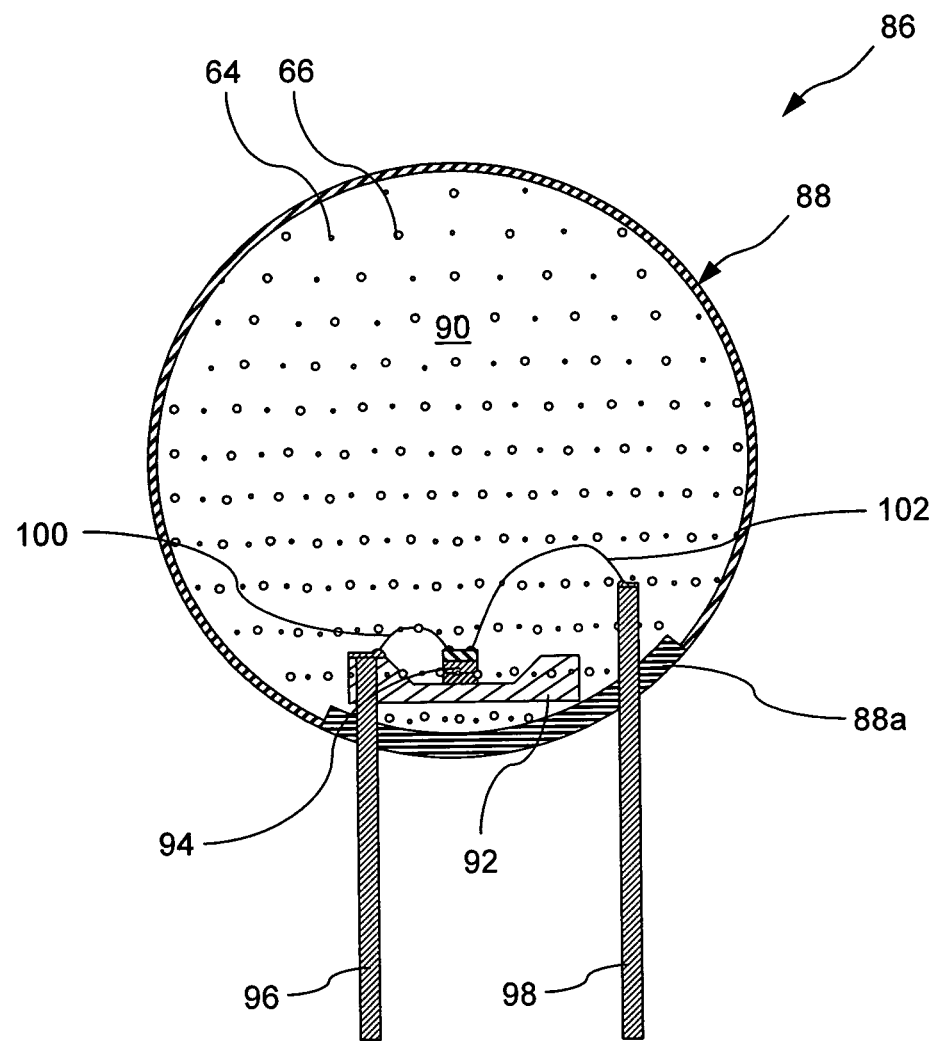
FIG. 5 shows a section of a LED, the interior of which is filled with a carrier medium which is loaded with luminous material particles and reflection particles.

In FIG. 5, a LED 86, which has a spherical transparent housing 88 with a removable cover part 88a, is shown. The housing 88 delimits a chamber 90, in which a carrier substrate 92, which corresponds to the carrier substrate 46, and which carries a semiconductor element 94 corresponding to the semiconductor elements 40, is arranged. The carrier substrate 92 is held by a first terminal 96, which extends outward through the cover part 88a and is immovably connected to the cover part 88a. A second terminal 98 similarly extends out of the chamber 90 of the LED 86 through the cover part 88a of the housing 88, to which it is permanently connected. In the case of the LED 86, the housing 88 fulfils the function of the chamber 60 in the case of the bulb lamps 10 according to FIGS. 1 to 4.

The semiconductor element 94 is connected via bonding wires 100 and 102 to the terminals 96, 98, and an operating voltage can be applied to it via the latter.

The chamber 90 of the LED 86 is filled with the carrier medium 62, in which luminous material particles 64 and reflection particles 66 are distributed, as was explained above in relation to the bulb lamps 10 according to FIGS. 1 to 4.

If an elastic silicone mass is to be used as the carrier medium 62, in production of the LED 86, the housing 88, with the cover part 88a removed, can be filled in layers with relatively low-viscosity silicone oil, which has previously been mixed with a curing agent and the necessary quantity of luminous material particles 64 and reflection particles 66 for the desired particle number density. The silicone oil then cures into an elastic silicone mass 62, in a way which is known per se. After a first layer is cured, a further layer of silicone material 62 with luminous material particles 64 and reflection particles 66 can be produced correspondingly on the first layer. For this purpose, the housing 88 can have a filler neck, which is not specifically shown here.

With the LED 86, light can be emitted over a range of substantially 360°.

In practice, the diameter, averaged if appropriate, of the chambers 60, 76, 80, 84 in the case of the bulb lamps 10 according to FIGS. 1 to 4, and the chamber 90 in the case of the LED 86, is, for example, between 1 mm and 300 mm, preferably between 1 mm and 200 mm, and again preferably between 3 mm and 30 mm. In practice, starting from the semiconductor structures 40 or the semiconductor structure 94, the height of the chambers 60, 76, 80, 84 or 90 is, for example, between 3 mm and 300 mm, preferably between 3 mm and 150 mm, and again preferably between 10 mm and 60 mm.

Figure 6:
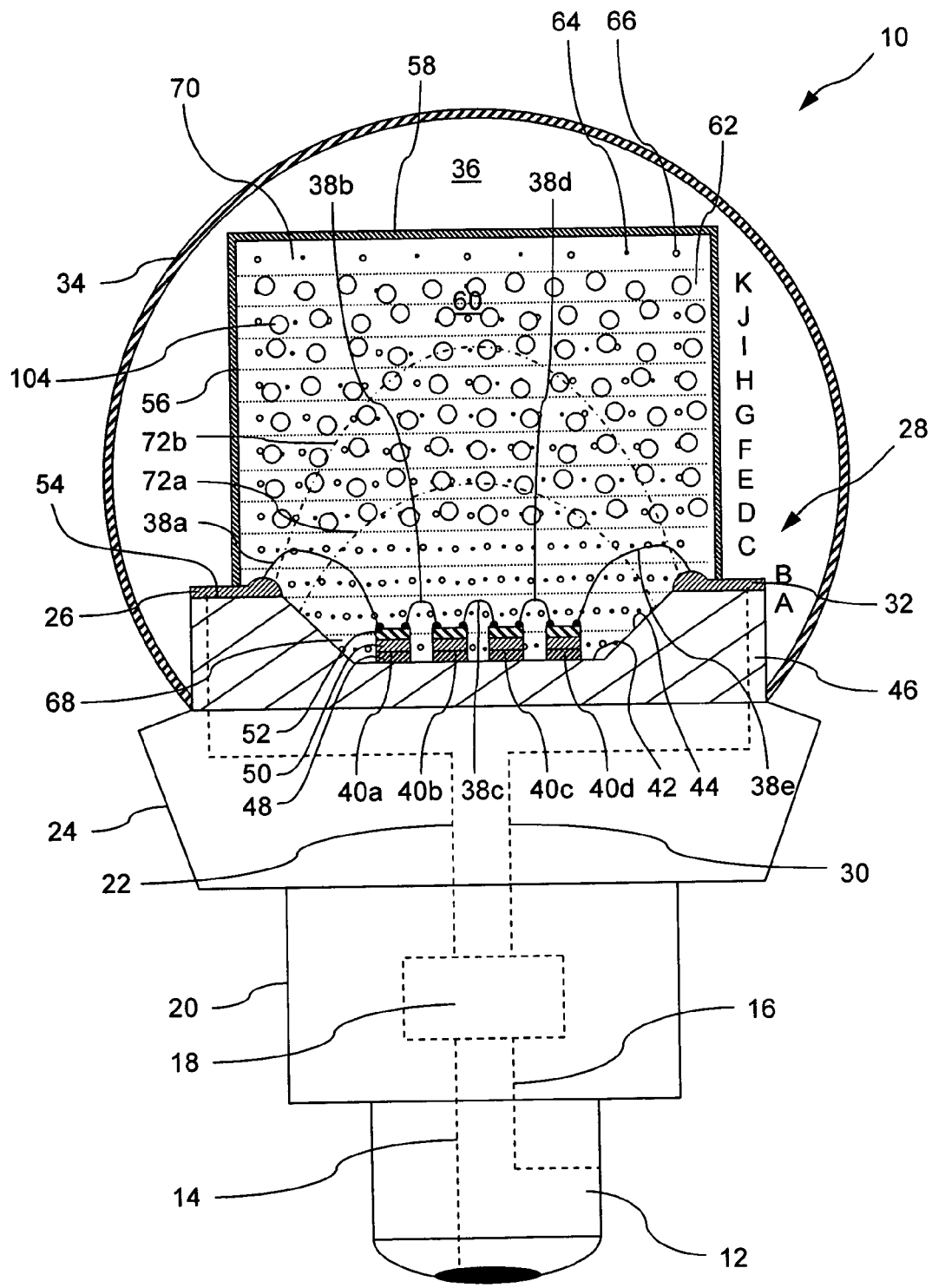
FIG. 6 shows a modification of the bulb lamp according to FIG. 1, wherein air bubbles are provided in the carrier medium.

In FIG. 6, another bulb lamp 10 is shown. It differs from the bulb lamp 10 according to FIG. 1 only in that in the intermediate layers D to K in the chamber 60, as well as the luminous material particles 64 and reflection particles 66, air bubbles 104, of which only one is provided with a reference symbol in FIG. 6, are present.

The air bubbles 104 of each layer D to K are, for example, generated while the chamber 60 is filled in layers, as explained above. One way in which this can be done, for example, is that in the relatively low-viscosity silicone oil, which is provided with a curing agent, and to which the necessary quantities of luminous material particles 64 and reflection particles 66 for the desired particle number densities have been added, before the chamber is filled, brisk stirring and thus virtual whisking take place, so that air is worked into the silicone oil in the form of the air bubbles 104. If appropriate, the air bubbles 104 can also be generated first, and only afterwards the necessary quantities of luminous material particles 64 and reflection particles 66 for the desired particle number densities can be added to the silicone oil to which air bubbles 104 have been added.

The concentration of air bubbles 104 within each layer can, for example, be influenced by the briskness of the whisking or the type of stirrer or whisk. In practice, it has been shown to be advantageous if the concentration of air bubbles 104 has a value of 500 to 20,000 air bubbles per $cm^3$, preferably a value of 1,000 to 10,000 air bubbles per $cm^3$, and specially preferably a value of 3,000 to 5,000 air bubbles per cm³. The air bubbles 104 preferably have a diameter of about 0.1 mm to 2 mm, preferably 0.1 mm to 1 mm, and again preferably 0.2 mm to 0.5 mm.

In the case of this embodiment of the bulb lamp 10, the thickness which is determined by the three bottom layers A, B and C is chosen so that the layer D, which is provided with air bubbles 104, is arranged at a distance of 1 mm to 10 mm from the semiconductor structures 40.

In the layers 68, A, B, C and 70, no air bubbles 104 are provided. However, in a modification, air bubbles 104 can be put into these layers or some of these layers, as explained above.

It has been shown that a different lighting effect of the bulb lamp 10 can be achieved if air bubbles 104 are present in the silicone mass 62.

As mentioned above, the layers 68, A to K and 70 of the silicone mass 62, with the luminous material particles 64, the reflection particles 66 and/or the air bubbles 104, in the case of the corresponding bulb lamps 10 of FIGS. 1 to 4 and 6 can be generated in various ways, e.g. by filling the housing 56, 74, 78 or 82 in layers and then installing the cured layers 68, A to K and 70 on the light chip arrangement 28, in which case the housing 56, 74, 78 or 82 can be assembled with it or previously removed. Alternatively, the layers 68, A to K and 70 can be attached directly to the light chip arrangement 28 by means of an injection moulding method, which is known per se, and cured there. This type of production is specially suitable for production of large numbers of units.

The outer contour of the silicone mass 62 in the form of the layers 68, A to K and 70 is not restricted to what is determined by the housing 56, 74, 78 or 82 explained above. By using different housings, or by individual formation by the injection moulding method, the outer contour of the silicone mass 62, which results from the layers 68, A to K and 70, can be formed as desired. The number of layers between the layers 68 and 70 can also be varied.

Figure 7:
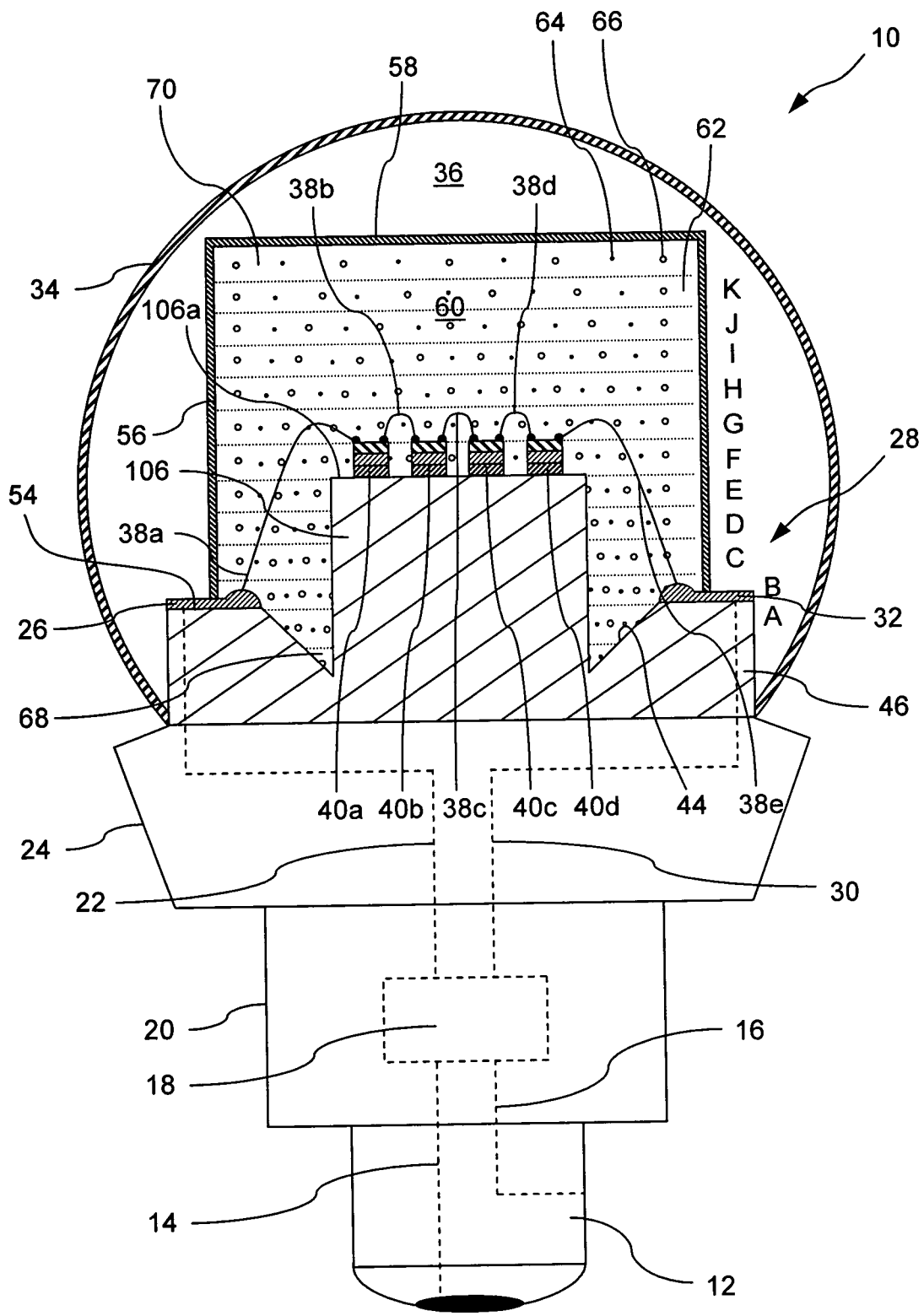
FIG. 7 shows a partial section, corresponding to FIG. 1, of a fifth embodiment of a bulb lamp.

In the case of the bulb lamp 10 in FIG. 7, the indentation 44 of the carrier substrate 46 does not grade into the floor 42, but into a base 106. On its upper side 106a away from the indentation 44 of the carrier substrate 46, this carries the semiconductor elements 40, and is in such a form that the latter are arranged in the chamber 60 approximately centrally between the first layer 68 and second layer 70 of the carrier medium 62.

In a modification (not shown here), the particle number density of the luminous material particles 64 and/or the reflection particles 66 can then decrease equally, starting from the position of the semiconductor elements 40, in the directions of both the first layer 68 of the carrier medium 62 and its second layer 70.

Figure 8:
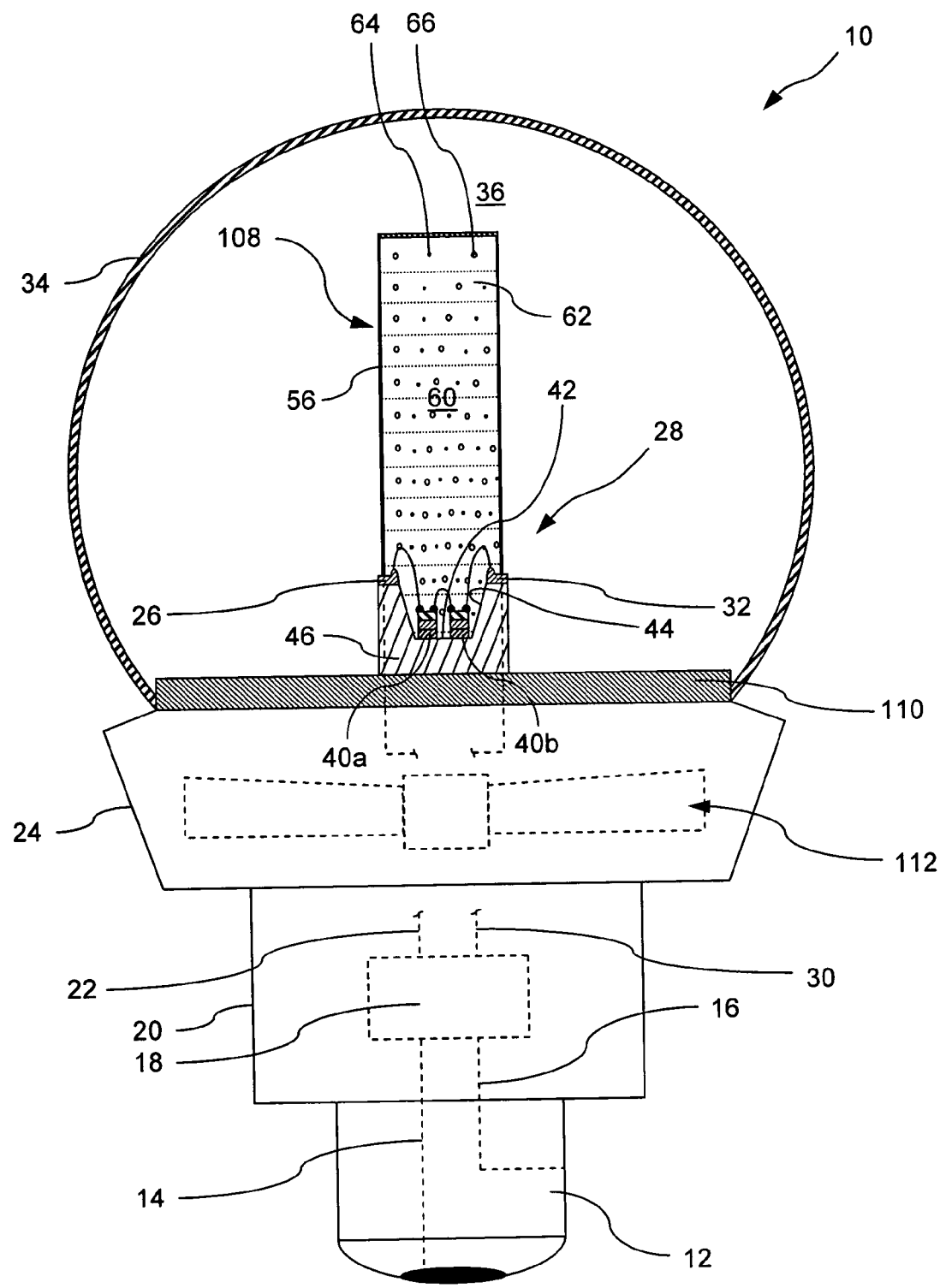
FIG. 8 shows a partial section, corresponding to FIG. 1, of a sixth embodiment of a bulb lamp, wherein the carrier medium is in the form of a light finger.

In FIG. 8, a bulb lamp 10, wherein the housing 56, with the carrier substrate 46 and the semiconductor elements 40, forms an approximately rod-shaped light finger 108, is shown. In the case of the shown embodiment, this is arranged along the bulb axis of the bulb 34 on a supporting plate 110, which itself is mounted on the heat sink 24. The carrier substrate 46 of the light finger 108 corresponds to the carrier substrate 46 of the bulb lamp 10 according to FIG. 1, but is narrower compared with the latter in the directions parallel to the floor 42 of the carrier substrate 46. In the indentation 44 of the carrier substrate 46 of the light finger 108, only two semiconductor elements 40a, 40b are arranged.

To support heat dissipation from the semiconductor elements 40, a fan 112 is integrated in the heat sink 24. It is supplied with energy via the voltage transformer 18, in a way which is known per se, and conducts heat away from the supporting plate 110.

Such a fan 112 can be provided in the case of all the embodiments described here. The fan 112 can be operated at a constant rotational speed. Alternatively, the rotational speed of the fan 112 can be changed depending on the prevailing temperature at the semiconductor elements 40.

Figure 9:
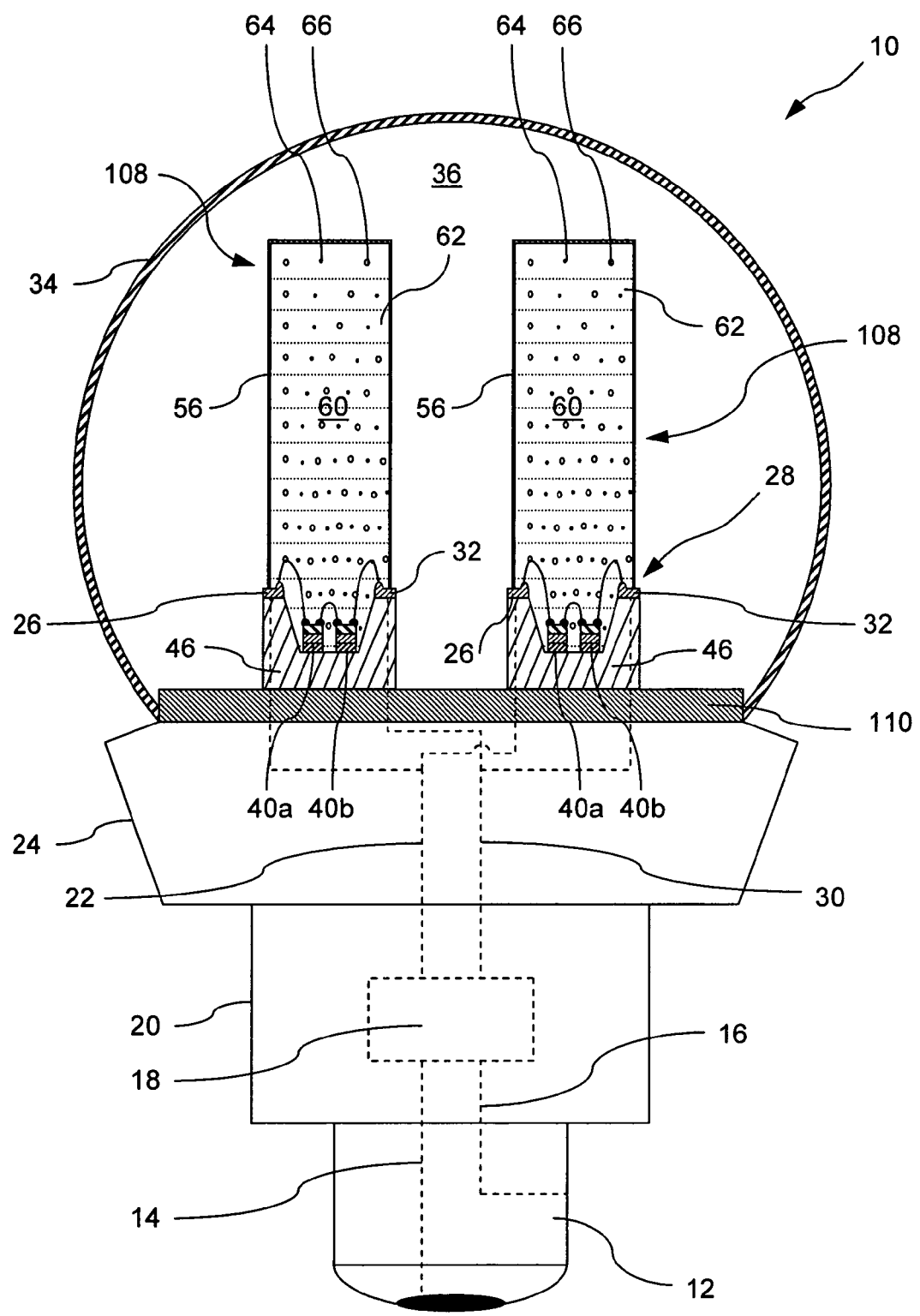
FIG. 9 shows a partial section, corresponding to FIG. 8, of a seventh embodiment of a bulb lamp, which has two light fingers.

In the case of the bulb lamp 10 shown in FIG. 9, two light fingers 108 are arranged on the supporting plate 110, and are supplied with energy via the voltage transformer 18.

Figure 10:
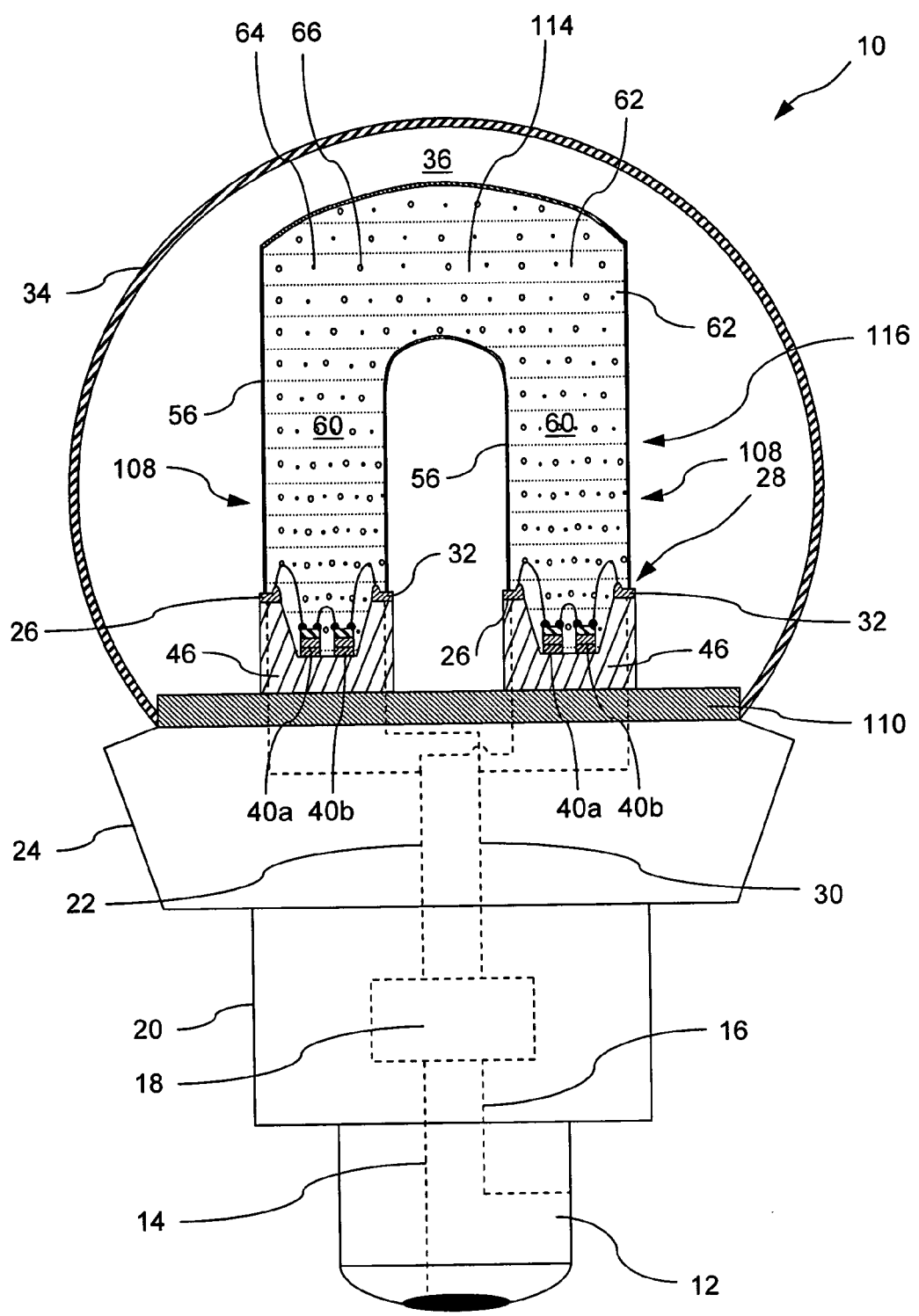
FIG. 10 shows a partial section, corresponding to FIG. 9, of an eighth embodiment of a bulb lamp, wherein two light fingers are combined into a light arch.

In the case of the modification shown in FIG. 10, two such light fingers 108 are connected at their ends away from the supporting plate 110 by means of a connecting bridge 114, for which purpose the housings 56 of the two light fingers 108, which are connected to each other, are correspondingly connected into a U-shaped housing 116. Thus in the case of the bulb lamp 10 according to FIG. 10, the carrier medium 62 occupies an approximately U-shaped volume.

Figure 11:
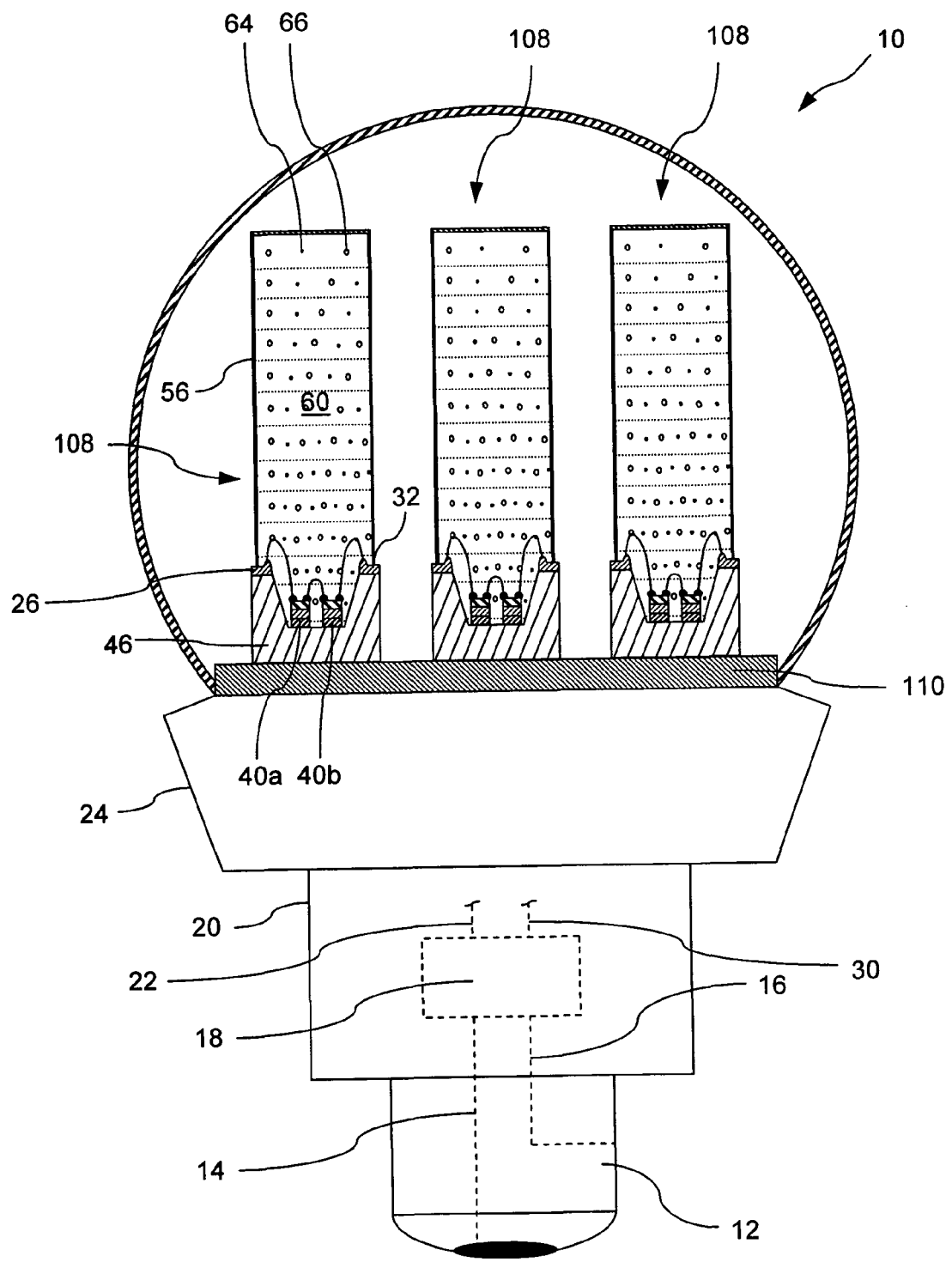
FIG. 11 shows a partial section, corresponding to FIG. 8, of a ninth embodiment of a bulb lamp, which includes three light fingers.

In the case of the bulb lamp 10 shown in FIG. 11, as a further modification, three light fingers 108 are arranged on the supporting plate 110. The three light fingers 108 can be arranged arbitrarily, e.g. in a row, as indicated in FIG. 11, at the vertices of an equilateral triangle, or in an asymmetrical arrangement. The course of the power supply lines 22 and 30 to the contact areas 26 and 32 respectively of the light fingers 108 is not shown in FIG. 11, for clarity.

The bulb lamps 10 according to FIGS. 9 and 11 each include multiple volumes which are formed from the carrier medium 62 and the luminous material particles 64 and reflection particles 66 which are distributed in it.

The volumes are determined by the housings 56 of each light finger 108. In other words, the bulb lamps 10 according to FIGS. 9 and 11 include multiple volumes which are determined by the carrier medium 62 with the luminous material particles 64 and reflection particles 66, and which are arranged at a distance from each other.

Figure 12:
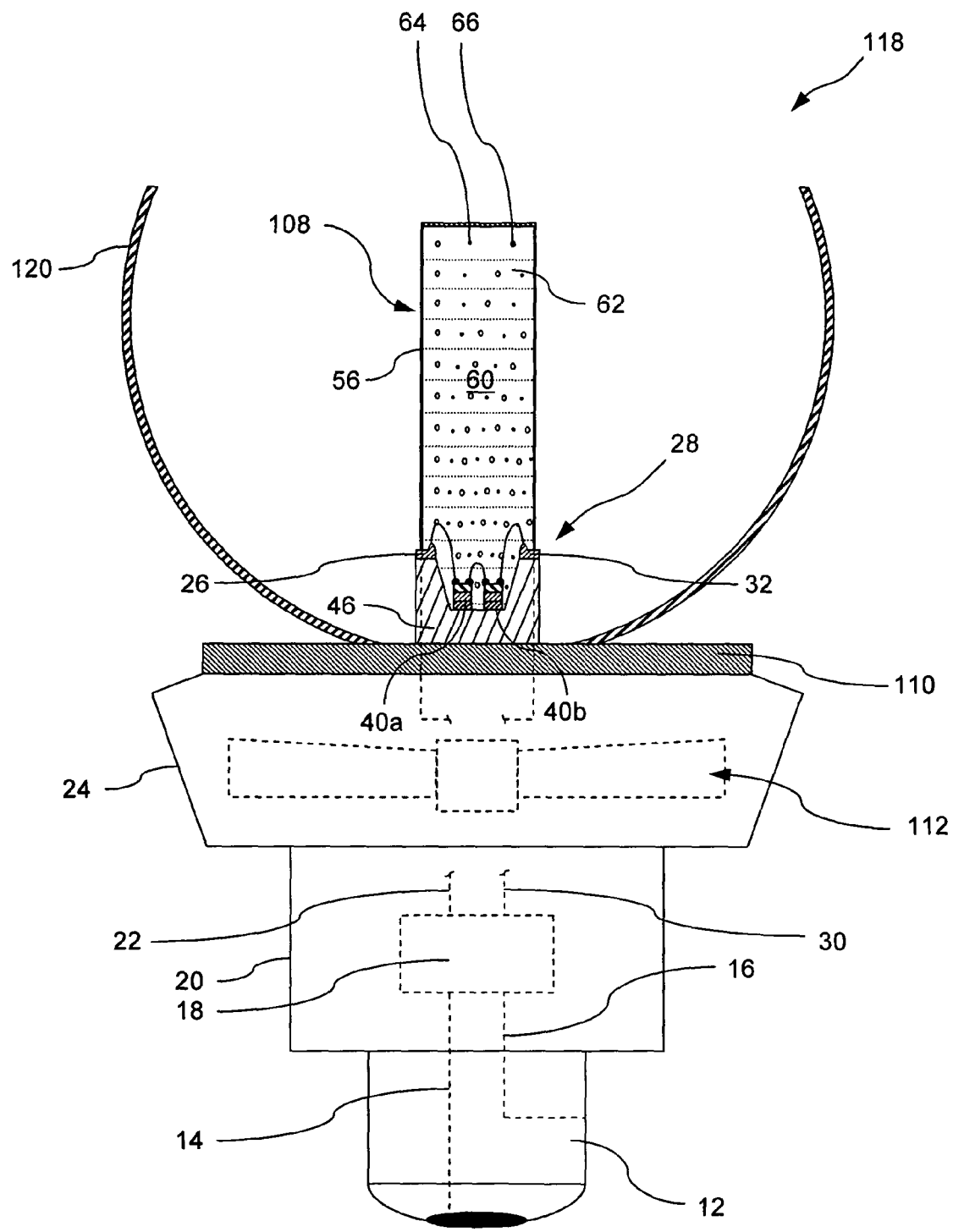
FIG. 12 shows a modification of the lamp according to FIG. 8, wherein instead of a glass bulb, a reflector is provided.

In FIG. 12, a reflector lamp 118 is shown, corresponding to a large extent to the bulb lamp 10 according to FIG. 8, with the difference that in the case of the reflector lamp 118 a bulb 34 is not provided, but instead a reflector 120, which is known per se, and which is open in the directions away from the supporting plate 110 and thus determines a light emergence opening through which the light which the reflector 110 bundles emerges, is provided.

Figure 13:
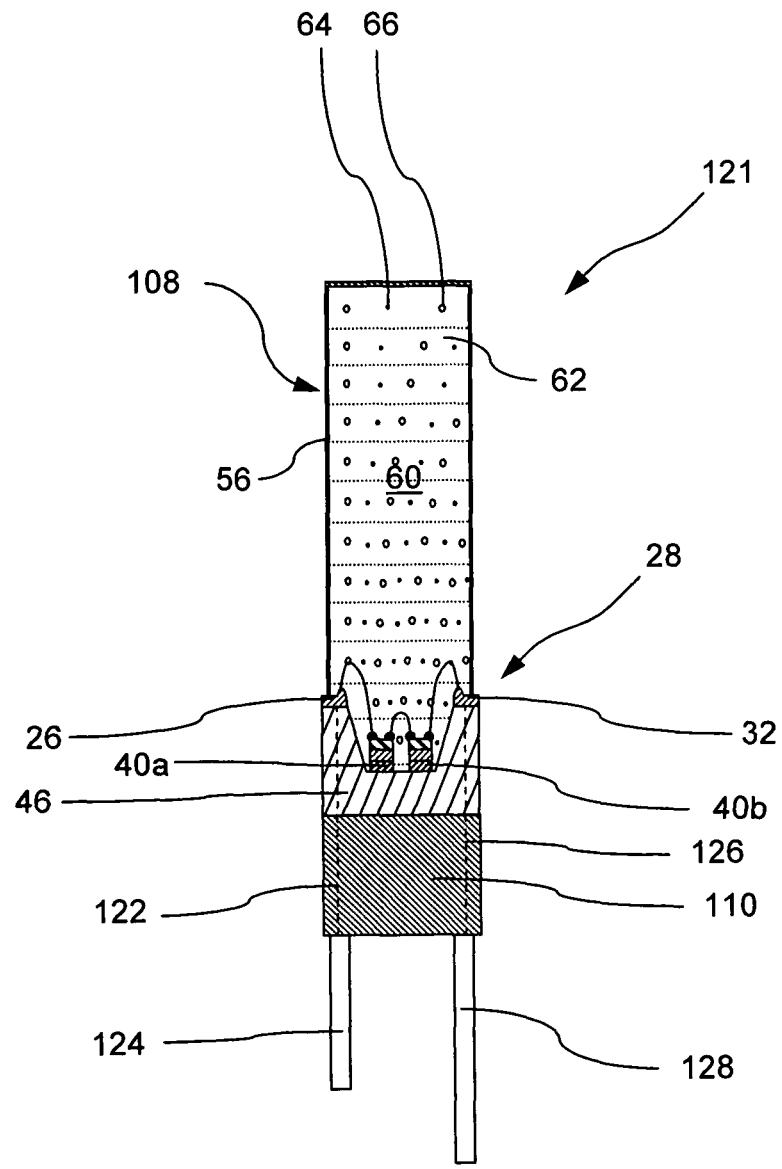
FIG. 13 shows separately a light finger such as is used in the lamps according to FIGS. 8, 9, 11 and 12.

In FIG. 13, a lamp element 121 which is formed from a single light finger 108, and the carrier substrate 46 of which is arranged on a supporting plate 110, the clear outer contour of which corresponds to that of the carrier substrate 46, is shown. As can be seen in FIG. 13, the contact areas 26 and 32 on the carrier substrate 46 are connected via a line 122 to a connecting wire 124 and via a line 126 to a connecting wire 128 respectively. The connecting wires 124, 128 emerge from the supporting plate 110 on the side away from the carrier substrate 46. A light finger 108 in this form can be wired like a traditional LED on a corresponding board.

Multiple light fingers 108 or lamp elements 121 can be used, for example, as light sources in video projection devices. In this case multiple light fingers 108 or each light finger 108 separately can work with a corresponding reflector, which bundles the light in a desired direction.

Figure 14:
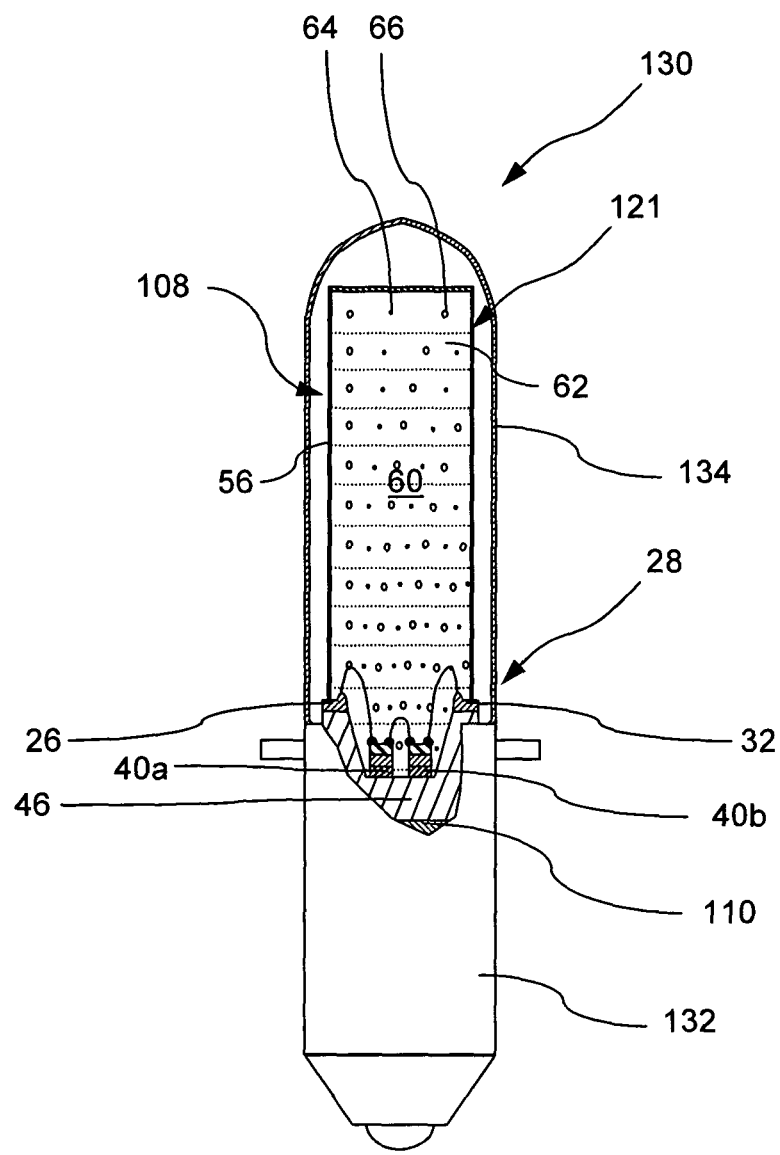
FIG. 14 shows an illuminant which includes a light finger according to FIG. 13, for a bicycle or motor vehicle lighting system.

In FIG. 14, as a further embodiment of the lamp element 121 or light finger 108, a lamp 130 such as can be used in lighting systems of bicycles and/or motor vehicles is shown. For this purpose, the lamp 130 includes a corresponding standardised connection base 132, which is shown only schematically in FIG. 14, and a bulb 134 which it holds, and which surrounds the carrier medium 62 in the housing 56 of the light finger 108 while maintaining a slight distance.

Figure 15:
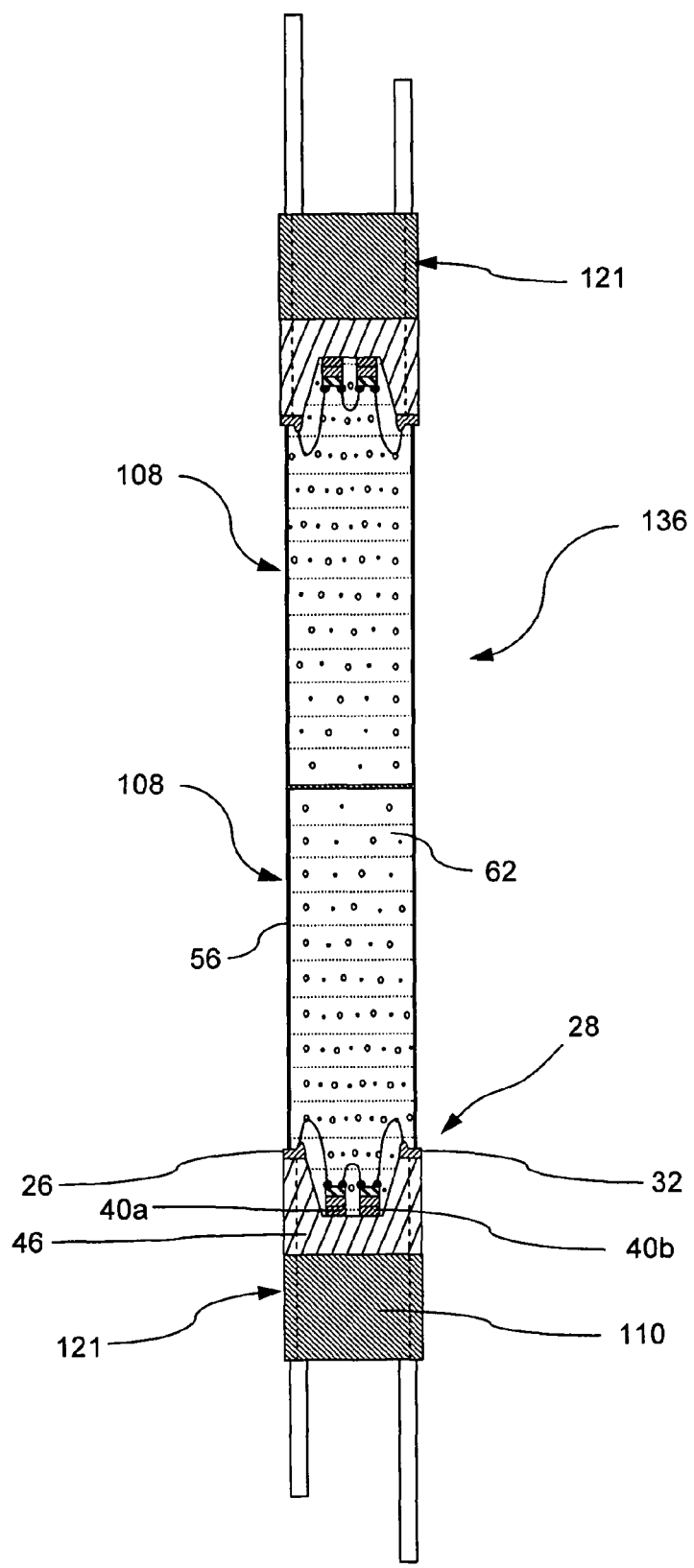
FIG. 15 shows a rod-shaped lamp element formed from two light fingers according to FIG. 13 opposite each other.

In FIG. 15, a rod-shaped lamp element 136, which is formed from two lamp elements 121 which adjoin each other at their faces away from the respective carrier substrates 46, is shown. The light fingers 108 or the lamp elements 121 can be fixed in this arrangement in a separate housing, which is not shown specifically here. The two light fingers 108 can also be glued to each other on faces opposite each other, for stabilisation.

The rod-shaped lamp element 136 can have different lengths, in particular lengths of 1 cm to 50 cm, preferably 2 cm to 10 cm.

Figure 16:
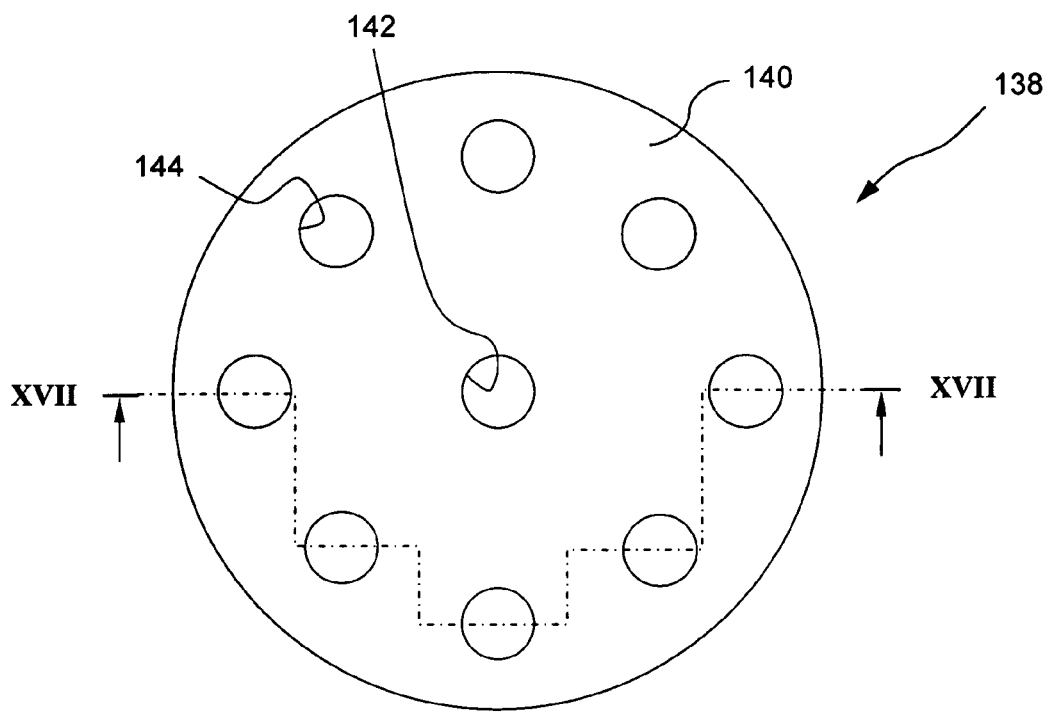
FIG. 16 shows a cylindrical illuminant, wherein light finger structures are arranged in locating channels of a transparent cylinder.
Figure 17:
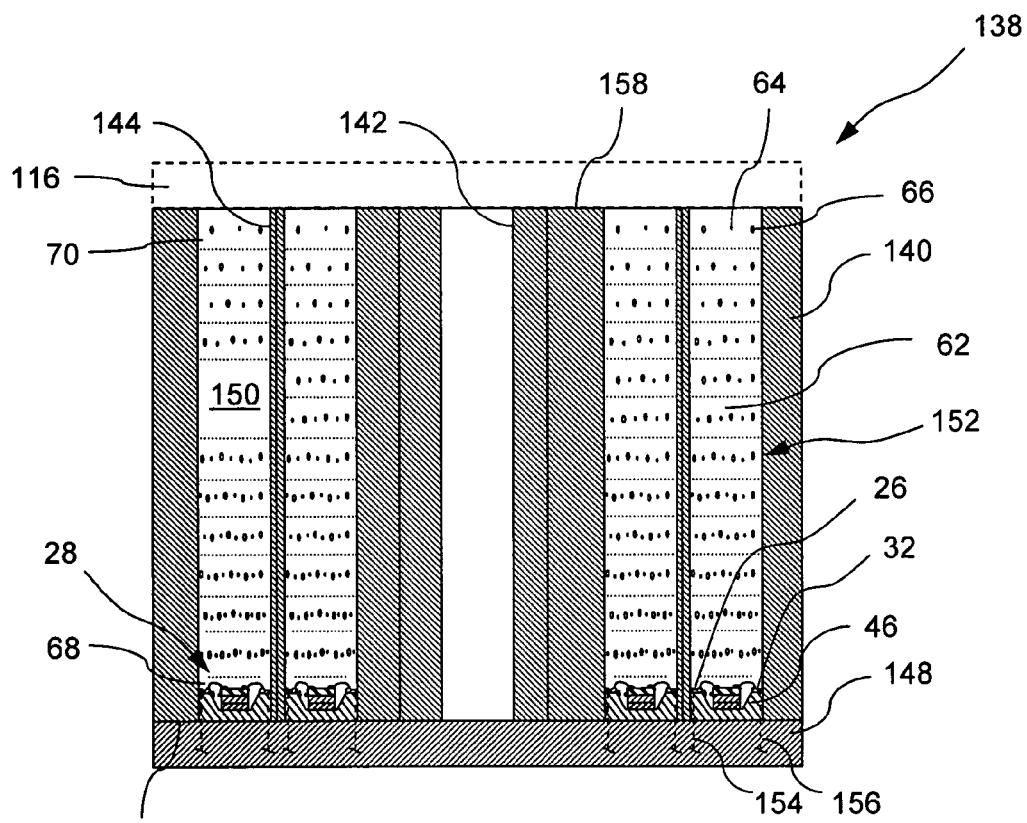
FIG. 17 shows a cross-section through the illuminant of FIG. 16, along the bent cross-section line XVII-XVII there.

In FIGS. 16 and 17, 138 designates a cylindrical lamp, which includes a transparent lamp cylinder 140, which for example can be produced from glass or acrylic glass. In practice, the lamp cylinder 140 has a diameter of 3 mm to 100 mm, preferably 8 mm to 30 mm, and again preferably 5 mm to 15 mm, but in total can be arbitrarily large.

The lamp cylinder 140 has a through channel 142, which is coaxial with its longitudinal axis, and eight further through channels 144 which all have a constant circular cross-section. Of the through channels 144, in FIGS. 16 and 17 only one is provided with a reference symbol. Preferably, the lamp cylinder 140 includes between one and ten through channels 142, 144. It is not always necessary to provide a central through channel 142. The cross-section of the through channels 142, 144 can also differ from a circular cross-section.

On one face 146, the lamp cylinder 140 carries a floor plate 148 with an outer contour which is complementary to the lamp cylinder 140.

In each of the through channels 142 and 144, a carrier substrate 46 is arranged, is carried by the floor plate 148, and in the case of the present embodiment carries only a single semiconductor structure 40. The through channels 142 and 144 in the lamp cylinder 140 each delimit a cylindrical chamber 150, the volume of which is filled with the carrier medium 62, in which the luminous material particles 64 and reflection particles 66 are held in the layers 68 and 70 and the layers between them, which are not specifically provided with reference symbols, with different particle densities. If different semiconductor structures 40 are used in the various through channels 142, 144, and emit in the red, green and blue and together give white light, the luminous material particles 64 can be forgone.

Thus in the through channels 142, 144 of the lamp cylinder 140, a light finger structure 152 which substantially corresponds to the light finger 108, but merely does not include its own housing delimiting the chamber 150, is arranged. Not all through channels 142, 144 of the lamp cylinder 140 must be provided with such a light finger structure 152, for which reason, as an illustration, the through channel 140 in FIG. 17 is shown empty.

The contact areas 26 and 32 on the carrier substrate 46 are supplied with energy via lines 154 and 156, which can be connected via terminals (which here are of no further interest) in the floor plate 148 to the mains or a battery.

If required, the lamp cylinder 140 can carry, on its second face 158, a cover plate 160, which in the embodiment shown here is shown only by a dashed line.

In practice, the through channels 142, 144 in the lamp cylinder 140 have a diameter of 0.1 mm to 15 mm, preferably 1 mm to 10 mm, and again preferably 2 to 5 mm. The diameters of the through channels 142, 144 in the lamp cylinder 140 can also be different from each other, and usually depend on the dimensions of the semiconductor element 40 to be housed in them. The lamp cylinder 140 itself has a length of 5 mm to 800 mm, preferably 20 mm to 150 mm, and again preferably 20 to 50 mm, but can be longer or shorter as required.

Figure 18:
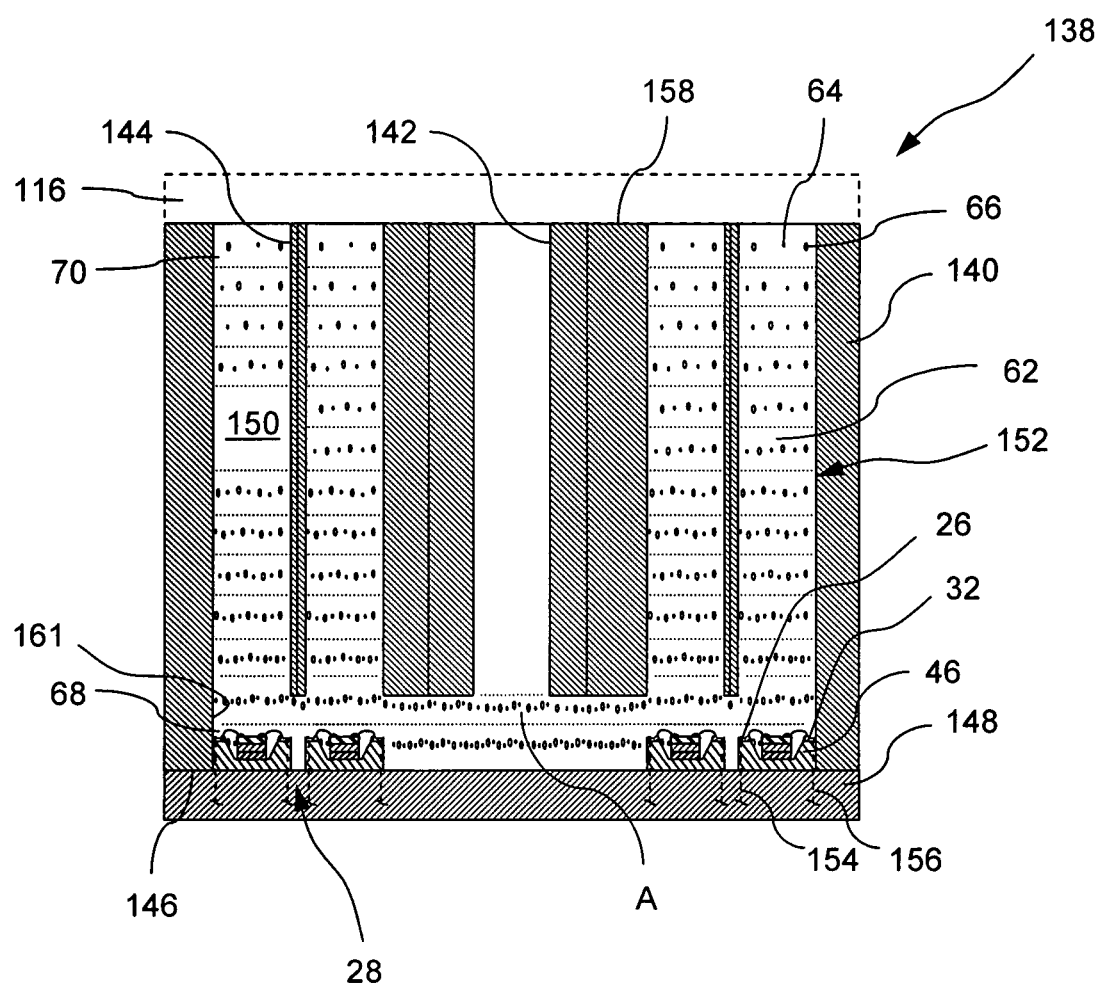
FIG. 18 shows a cross-section, corresponding to FIG. 17, through a modification of the illuminant according to FIG. 18, wherein the locating channels are connected to each other.

In the case of the modification of the lamp 138 shown in FIG. 18, the through channels 142, 144 are connected to each other on the side 146 of the lamp cylinder 140 by an indentation 161 in the shape of a circular disc being worked into it. In the indentation 161, there are the two layers 68 and A of silicone material 62 which are arranged nearest the semiconductor structures 40, and in which luminous material particles 64 and reflection particles 66 are present. Thus light from the semiconductor structures 40 can be transmitted even into adjacent light finger structures 152.

In FIGS. 19 and 20, a light band 162 is shown. It includes a flexible envelope 164, which delimits a chamber 165 and on one side has multiple hemispherical bulges 166, which are formed in the longitudinal direction of the light band 162 in succession at a slight distance from each other. The bulges 166 can also have geometries which are different from a hemisphere and, for example, be of conical form. In a modification, it is also possible to provide no bulges 166.

On the inner surface 168 opposite the bulges 166, the envelope 164 carries a flexible track element 170, on which multiple semiconductor structures 40 are connected to each other in a way which is known per se. For example, sets of multiple semiconductor structures 40 can always be connected in series, several of these sets being connected in parallel.

The semiconductor structures 40 are arranged so that each semiconductor structure 40 comes to lie approximately centrally under a bulge 166.

Between the track element 170 and the inner surface 172, which is determined by the bulges 166, of the envelope 164, layers 68, A, B and 70 of silicone material 62, with luminous material particles 64 and reflection particles 66 distributed in them, are arranged. The particle number density of the luminous material particles 64 and reflection particles 66 decreases from the layer 68 to the layer 70 with increasing distance from the semiconductor structures 40. In the case of the light band 162 too, the luminous material particles 64 can be forgone if different semiconductor structures 40, which emit in the red, green and blue and together give white light, are used.

The semiconductor structures 40 are supplied with energy via connections which are not specifically shown, in a way which is known per se, if they are connected to an energy source.

In practice, the light band 162 is between 1 mm and 20 mm wide, preferably between 3 mm and 15 mm, and again preferably between 8 mm and 12 mm, and between 1 mm and 10 mm thick, preferably between 2 mm and 5 mm.

When the semiconductor structures 40 within the light band 162 are activated, the light band 162 lights essentially homogeneously, and no discrete light areas can be seen at the location of the semiconductor structures 40. The light band 162 can therefore be used in fields where otherwise neon tubes or similar were used, e.g. for luminous advertising. The light band 162 can also be used to couple light into an optical waveguide element, e.g. an optical waveguide board. For this purpose, for example, the light band 162 is glued along the circumference of an optical waveguide board, on its narrow surfaces.

In FIGS. 21 and 22, a light panel 174 in the form of a board is shown. On the inner surfaces of two opposite narrow sides 176 and 178 of a jacket 177 surrounding a chamber 175, multiple semiconductor elements 40 are each connected to a track element 180 and 182, as was explained above about the light band 162.

In the direction away from each of the track elements 180 and 182, layers 68, A, B and C of silicone material 62 with luminous material particles 64 and reflection particles 66 distributed in it are arranged, so that two layers C adjoin each other centrally between the track elements 180 and 182. The particle number densities in the two layers 68 are equal, and similarly in the two layers A, the two layers B and the two layers C.

The particle number density of the luminous material particles 64 decreases from a layer 68 via the layers A and B near it to the layers C. In contrast, the particle number density of the reflection particles 66 increases from a layer 68 via the layers A and B near it to the layers C. In the case of the light panel 174 too, the luminous material particles 64 can be forgone if different semiconductor structures 40, which emit in the red, green and blue and together give white light, are used.

The light panel 174 is flexible because of the silicone material 62, and can be put into various shapes and fixed in them if required.

In practice, the light panel 174 is between 1 mm and 20 mm thick, preferably between 3 and 5 mm.

If the semiconductor structures 40 are active, the light panel 174 emits light with an even light distribution over its main surfaces 184, one of which can be seen in FIG. 22.

All the embodiments of FIGS. 1 to 22 explained above were explained with regard to the use of semiconductor structures 40 which emit radiation in the ultraviolet or visible wavelength range. Alternatively, other semiconductor structures which emit radiation of other wavelengths, in particular radiation in the infrared, can also be used.

In the case of all the embodiments explained above of FIGS. 1 to 18, multiple layers 68, A to K and 70 are provided from the silicone mass 62, the particle number density of the luminous material particles 64 and reflection particles 66 changing in a direction away from the semiconductor structures 40, and in particular decreasing in this direction. In the case of the embodiments of FIGS. 19 to 22, fewer layers from the silicone mass 62, with different particle number densities of the luminous material particles 64 and reflection particles 66, are present.

However, to achieve a good light colour or lighting effect, in principle it is sufficient if at least three such layers or regions, in which the luminous material particles 64 and/or the reflection particles 66 are present with different particle number densities, are provided. The change, in particular the reduction, of the particle number density of the luminous material particles 64 or reflection particles 66 in a direction away from the semiconductor structures 40 can also take place unevenly, i.e. in steps of different sizes, even if an even change leads to a better result.

It is to be understood that additional embodiments of the present invention described herein may be contemplated by one of ordinary skill in the art and that the scope of the present invention is not limited to the embodiments disclosed. While specific embodiments of the present invention have been illustrated and described, numerous modifications come to mind without significantly departing from the spirit of the invention, and the scope of protection is only limited by the scope of the accompanying claims.

The invention claimed is:

1. A lamp device comprising:
   a) illuminants, which emit a primary radiation when voltage is applied to them;
   b) luminous material particles which absorb the primary radiation and emit a secondary radiation;
   c) reflection particles which at least partly enclose the illuminants and which scatter the primary radiation and the secondary radiation;
   wherein
   d) a particle number density of the reflection particles changes in at least one direction away from the illuminants from a first particle number density to a second particle number density and a greatest particle number density of reflection particles is present in a first region, which is arranged closest to the illuminants compared with other regions and a smallest article number density of reflection s articles is present in a second region, which is furthest from the illuminants compared with other regions; and wherein,
   e) the change of particle number density is a reduction, and
   f) the smallest particle number density is greater than zero.

2. The lamp device of claim 1, wherein the particle number density is reduced evenly.

3. The lamp device of claim 1, wherein the greatest particle number density of reflection particles is 5 to 10,000 times the smallest particle number density.

4. The lamp device of claim 1, wherein
   a) the greatest particle number density is between 500 and 20,000 particles per cubic centimetre; and,
   b) the smallest particle number density is between 1 and 5,000 particles per cubic centimetre.

5. The lamp device of claim 1, wherein the reflection particles are held in their position relative to the illuminants by a carrier medium.

6. The lamp device of claim 5, wherein the carrier medium is a silicone material.

7. The lamp device of claim 5, wherein the carrier medium with the particles occupies a cylindrical, conical or hemispherical volume, or a volume which includes a section which is in the form of a truncated cone and blends into a spherical section, or an approximately U-shaped volume.

8. The lamp device of claim 5, wherein the carrier medium with the particles is arranged in a chamber of the lamp device.

9. The lamp device of claim 8, wherein regions of a chamber wall is made of glass or synthetic material.

10. The lamp device of claim 5, wherein multiple air bubbles are provided in the carrier medium.

11. The lamp device of claim 10, wherein a concentration of air bubbles in the carrier medium has a value of 500 to 20,000 air bubbles per cm$^3$.

12. The lamp device of claim 10, wherein the air bubbles have a diameter of 0.1 mm to 2 mm.

13. The lamp device of claim 5, further comprising: multiple volumes which are determined by the carrier medium with the solid particles, and which are arranged at a distance from each other.

14. The lamp device of claim 13, further comprising: two volumes.

15. The lamp device of claim 13, further comprising three volumes.

16. The lamp device of claim 13, the volumes are provided in multiple receiving regions of a light source.

17. The lamp device of claim 16, wherein the light source is cylindrical and the receiving regions are in the form of channels parallel to an axis of the light source.

18. The lamp device of claim 1, wherein the illuminants include at least one semiconductor structure which emits light when voltage is applied to it.

19. The lamp device of claim 18, wherein the at least one light-emitting semiconductor structure emits blue light when voltage is applied to it.

20. The lamp device of claim 18, wherein the illuminants include at least one red light semiconductor structure, at least one green light semiconductor structure and at least one blue light semiconductor structure.

21. The lamp device of claim 18, wherein the illuminants include at least one infrared semiconductor structure and/or at least one ultraviolet semiconductor structure.

22. The lamp device of claim 18, wherein there are at least three layers in which the solid particles are present with different particle number densities.

23. The lamp device of claim 1 wherein the reflection particles are barium sulfide, barium sulfite, barium sulphate, or titanium dioxide.

\* \* \* \* \*

UNITED STATES PATENT AND TRADEMARK OFFICE
CERTIFICATE OF CORRECTION

| | |
|---|---|
| PATENT NO. | : 8,456,077 B2 |
| APPLICATION NO. | : 12/991086 |
| DATED | : June 4, 2013 |
| INVENTOR(S) | : Georg Diamantidis |

It is certified that error appears in the above-identified patent and that said Letters Patent is hereby corrected as shown below:

In the Claims

In Claim 1 at Col. 14, line 13       Delete "article" and insert -- particle --.

In Claim 1 at Col. 14, line 14       Delete "s articles" and insert -- particles --.

In Claim 4 at Col. 14, line 28       Delete "1" and insert -- 2 --.

Signed and Sealed this
Thirtieth Day of July, 2013

Teresa Stanek Rea
*Acting Director of the United States Patent and Trademark Office*